United States Patent
Fushimi et al.

(10) Patent No.: US 8,088,635 B2
(45) Date of Patent: Jan. 3, 2012

(54) VERTICAL GEOMETRY LIGHT EMITTING DIODE PACKAGE AGGREGATE AND PRODUCTION METHOD OF LIGHT EMITTING DEVICE USING THE SAME

(75) Inventors: Hiroshi Fushimi, Tokyo (JP); Kengo Nishiyama, Saga (JP); Kouji Kudou, Saga (JP); Itsuki Yamamoto, Saga (JP); Kazuma Mitsuyama, Saga (JP)

(73) Assignee: C.I. Kasei Company, Limited, Tokyo (JP)

( * ) Notice: Subject to any disclaimer, the term of this patent is extended or adjusted under 35 U.S.C. 154(b) by 333 days.

(21) Appl. No.: 12/445,717

(22) PCT Filed: Oct. 16, 2007

(86) PCT No.: PCT/JP2007/070509
§ 371 (c)(1),
(2), (4) Date: Apr. 15, 2009

(87) PCT Pub. No.: WO2008/047933
PCT Pub. Date: Apr. 24, 2008

(65) Prior Publication Data
US 2010/0187546 A1    Jul. 29, 2010

(30) Foreign Application Priority Data

| Oct. 17, 2006 | (JP) | 2006-282634 |
| Oct. 17, 2006 | (JP) | 2006-282635 |
| Oct. 26, 2006 | (JP) | 2006-291220 |
| Nov. 8, 2006  | (JP) | 2006-302731 |
| Mar. 9, 2007  | (JP) | 2007-060180 |

(51) Int. Cl.
*H01L 21/00*    (2006.01)

(52) U.S. Cl. ............... 438/22; 438/25; 438/26; 438/27; 438/28; 438/29; 257/E33.056

(58) Field of Classification Search ............ 257/E33.056
See application file for complete search history.

(56) References Cited

U.S. PATENT DOCUMENTS 6,921,674 B2 * 7/2005 Horiuchi et al. ............... 438/26
(Continued)

FOREIGN PATENT DOCUMENTS

JP    58-201388    11/1983
(Continued)

*Primary Examiner* — Thien F Tran
(74) *Attorney, Agent, or Firm* — Finnegan, Henderson, Farabow, Garrett & Dunner, L.L.P.

(57) ABSTRACT

There are provided a vertical geometry light emitting diode package aggregate useful for the production of a light emitting device having a vertical geometry light emitting diode as the light source, the light emitting device satisfying requirements in terms of current capacity flowed for light emission, dissipation of heat generated due to flow of a large current, resistance to thermal stress, strength of device and light emission efficiency, and a method for producing a light emitting device having a vertical geometry light emitting diode as the light source by using the package aggregate. The vertical geometry light emitting diode package comprises a metal sheet having formed thereon a number of vertical geometry light emitting diode package units, each package unit comprising two or more substrate portions as a part of the metal sheet, which are separated by a slit, and a reflector having a penetrating opening and being adhered to the two or more substrate portions to cover parts of the slit such that the vertical geometry light emitting diode-mounting position is exposed in the inner side of the opening and at the same time, the end part of the slit is exposed in the outer side of the reflector.

11 Claims, 22 Drawing Sheets

U.S. PATENT DOCUMENTS

| | | | |
|---|---|---|---|
| 7,268,014 B2 * | 9/2007 | Lee et al. | 438/106 |
| 7,999,277 B2 * | 8/2011 | Fushimi et al. | 257/98 |

FOREIGN PATENT DOCUMENTS

| | | |
|---|---|---|
| JP | 61-281578 | 12/1986 |
| JP | 1-181490 | 7/1989 |
| JP | 2-94688 | 4/1990 |
| JP | 2-116186 | 4/1990 |
| JP | 2000-244022 | 9/2000 |
| JP | 2001-244508 A | 9/2001 |
| JP | 2003-008074 A | 1/2003 |
| JP | 2003-31848 | 1/2003 |
| JP | 2003-303999 A | 10/2003 |
| JP | 2004-274027 | 9/2004 |
| JP | 2005-019609 A | 1/2005 |
| JP | 2005-116579 A | 4/2005 |
| JP | 2006-301209 A | 11/2006 |

* cited by examiner

VERTICAL GEOMETRY LIGHT EMITTING DIODE PACKAGE AGGREGATE AND PRODUCTION METHOD OF LIGHT EMITTING DEVICE USING THE SAME

TECHNICAL FIELD

The present invention relates to a package for a vertical geometry light emitting diode provided with an upper electrode and a lower electrode. More specifically, the present invention relates to a vertical geometry light emitting diode package aggregate, which is an aggregate of packages before producing light emitting devices having a vertical geometry light emitting diodes as the light source and is suitable for the mass production of such light emitting devices. The present invention also relates to a method for producing a light emitting device having a vertical geometry light emitting diode as the light source by using the package aggregate of the present invention.

BACKGROUND ART

FIGS. 25A and 25B are a schematic drawing and an overhead view explaining a light emitting diode assembly in the form of a light emitting device of the prior art having a light emitting diode as the light source thereof. In FIGS. 25A and 25B, a light emitting diode assembly 60 is composed of a printed wiring board 61, a submounting substrate 62 provided on the printed wiring board 61, a plastic hollow body 63 surrounding the periphery of the submounting substrate 62, a light emitting diode 65, and a transparent sealing resin 66 covering the light emitting diode 65.

The plastic hollow body 63 is integrally molded with a lead frame 64 by a thermosetting resin having an epoxy resin as a main component thereof. The printed wiring board 61 has printed wires 611 for the connection with a control circuit not illustrated for operating the light emitting diode 65 formed in a desired pattern by etching or the like. The submounting substrate 62 has a pair of wires 622 formed in the upper surface thereof by forming a vapor deposition pattern using etching or a mask.

In the plastic hollow body 63, the lead frame 64 passes through a sidewall. The plastic hollow body 63 is integrally produced by so-called insert or outsert molding (injection molding) in which a part of the lead frame 64 is embedded therein during molding. The plastic hollow body 63 reflects light emitted by the light emitting diode 65 with the surface of an inner wall thereof.

The light emitting diode 65 is provided with two electrodes 623 at the bottom, is cut out from a semiconductor wafer by dicing, and has the electrodes 623 connected to the wires 622 of the submounting substrate 62.

The transparent sealing resin 66 has heat resistance and is filled in the plastic hollow body 63 to form a flat or convex lens.

The light emitting diode package described in JP 2001-244508 A comprises two substrate portions insulated from each other, where a lower electrode of a vertical geometry light emitting diode is fixed to one substrate portion and an upper electrode of the vertical geometry light emitting diode is connected to the other substrate portion by a bonding wire.

In the surface-mounted light emitting device described in JP 2003-8074 A, flip chip light emitting diodes are fixed on substrate portions insulated from each other.

In the light emitting diode package described in JP 2005-19609 A, a flip chip light emitting diode is placed in a housing recess of a semiconductor substrate and the electrical connection to the light emitting diode is established by a wire.

Furthermore, in some conventional light emitting diode packages, a resin is inserted into an insulated part between electrically insulated metal cores. A production method of such a light emitting diode package is described, for example, in JP 2005-116579 A.

Also, in some conventional surface-mounted light emitting diodes, two divided metal core substrates are bonded together by an insulating adhesive and a submounting substrate is placed thereon. Such a surface-mounted light emitting diode is described, for example, in JP 2003-303999 A.

A flip chip light emitting diode of submounted type is advantageous in that by virtue of the absence of an electrode on the top thereof, the emitted light is entirely radiated to the outside.

On the other hand, as for a vertical geometry light emitting diode, development of those surpassing the flip chip emitting diode in terms of performance is proceeding. The vertical geometry light emitting diode allows a large current flow and enhanced illuminance, whereas the configuration of submounted type has a drawback that since heat generated from the diode can be hardly dissipated due to poor thermal conductivity, the package readily reaches a high temperature and this gives rise to occurrence of wiring disconnection or the like in the course of use. In addition, the submounted type also has a problem of poor productivity.

The vertical geometry light emitting diode now available becomes large-sized and assured of good emission efficiency and high illuminance. In a light emitting device using a vertical geometry light emitting diode, a wiring material, for example, a gold wire of 25 to 30 μm in diameter, is used for power supply to the light emitting diode, and the connection of the wiring material to the light emitting diode is performed by a thermosonic (ultrasonic thermocompression) method that is commonly used in wire bonding. However, the connection using this method has the following problems:

(1) the thickness of the wiring material used is limited and a large current cannot be passed or if a large current is passed, the material in the periphery burns out, (2) fluctuation is produced in the bonding strength of the wiring material and separation of the wiring material readily occurs, (3) the joining part is weak to vibrations and a sealing material is necessary for reinforcement, and (4) cracking is readily produced in the electrode of the light emitting diode or in the semiconductor layer due to ultrasonic oscillation and pressure during the connection and therefore, the apparatus used needs to be subtly adjusted.

The light emitting diode is being used as a light emitting element in various uses and, for example, is used in a backlight device of a liquid crystal display panel. For example, the backlight device described in JP 2006-301209 A is a device for illuminating a color liquid crystal display panel from the back side, where a plurality of light emitting element rows each having a plurality of light emitting elements (light emitting diodes) disposed in a line are arrayed in parallel in the inside of the backlight housing so that the distance between the light emitting element at the end of the light emitting element row and the side plate of the backlight housing can differ between adjacent light emitting element rows.

With respect to a method for producing a light emitting device using a large amount of light emitting diodes as used in the backlight device of a liquid crystal display panel, predetermined members are fixed to predetermined sites of a lead frame, and the lead frame is then cut, whereby a light emitting device is produced. The production of such a light emitting device involves joining together of different members, for example, between a substrate and a light emitting diode, between an electrode of a light emitting diode and a lead wire, and between a reflector and a substrate. For optimizing the joining together of different members, it has been necessary to strictly control the temperature in the process of producing a light emitting device. If the temperature control is insufficient, this adversely affects the light emitting diode in many cases.

DISCLOSURE OF THE INVENTION

In order to solve these problems, an object of the present invention is to provide an aggregate of vertical geometry light emitting diode packages each comprising a plurality of substrate portions insulated from each other by a slit, and a reflector adhered to the substrate portions to partially cover the slit, where the package aggregate has high strength, facilitates the temperature control in the production process of a light emitting device, and contributes to the enhancement of mass productivity of light emitting devices.

Another object of the present invention is to provide a method for producing a light emitting device having a vertical geometry light emitting diode as a light source, by using the above package aggregate.

The vertical geometry light emitting diode package according to the present invention is a vertical geometry light emitting diode package aggregate comprising a metal sheet having formed thereon a number of vertical geometry light emitting diode package units, for example, in a single row or a plurality of rows, and is characterized in that each package unit comprises two or more substrate portions as parts of the metal sheet, which are separated by a slit, and a reflector having a penetrating opening and being adhered to the two or more substrate portions to cover parts of the slit such that the vertical geometry light emitting diode-mounting position is exposed in the inner side of the opening, and the end parts of the slit are exposed in the outer side of the reflector.

In the periphery of each package unit, a peripheral slit divided into a plurality of portions and/or at least one peripheral weakened part may be provided. The peripheral slit and/or peripheral weakened part makes it easy to separate one light emitting device or a group consisting of a required number of light emitting devices from an aggregate of light emitting devices produced by mounting vertical geometry light emitting diodes on respective package units.

In the periphery of each package unit, a plurality of leads as parts of the metal sheet, with one end being connected to the package unit, and a peripheral opening divided into a plurality of portions by the leads may also be provided. The peripheral opening of each package unit is effective in reducing the heat capacity of the package aggregate having formed therein a number of package units and makes it easy to control the temperature when producing light emitting devices by mounting vertical geometry light emitting diodes on the package aggregate.

The present invention also provides a method for producing a light emitting device having a vertical geometry light emitting diode as a light source by using the package aggregate of the present invention.

The production method of a light emitting device of the present invention comprises the steps of: preparing a vertical geometry light emitting diode package aggregate comprising a metal sheet having formed thereon a number of vertical geometry light emitting diode package units, for example, in a single row or in a plurality of rows, each package unit comprising two or more substrate portions as parts of the metal sheet, which are separated by a slit, and a reflector having a penetrating opening and being adhered to the two or more substrate portions to cover parts of the slit such that the vertical geometry light emitting diode-mounting position is exposed in the inner side of the penetrating opening, and the end parts of the slit are exposed in the outer side of the reflector, and mounting a vertical geometry light emitting diode on one of the substrate portions of each package unit through the lower electrode thereof, and connecting the upper electrode of the vertical geometry light emitting diode to the substrate potion different from the substrate portion on which the vertical geometry light emitting diode is mounted, through a conductive connecting member, wherein the mounting and the connection are carried out by use of solder.

Mounting of a vertical geometry light emitting diode on one of the substrate portions and connection of an upper electrode of the vertical geometry light emitting diode to the other substrate portion may be performed simultaneously or separately.

In other words, in the production method of a light emitting device of the present invention, melting and subsequent solidification by cooling of solder disposed between one of the substrate portions and the lower electrode of the vertical geometry light emitting diode for mounting the vertical geometry light emitting diode on the one of the substrate portions may be performed simultaneously with melting and subsequent solidification by cooling of solder disposed between the upper electrode and the conductive connecting member and between the other substrate portion and the conductive connecting member for connecting the upper electrode of the vertical geometry light emitting diode to the other substrate portion through the conductive connecting member.

Alternatively, the vertical geometry light emitting diode may be mounted on one of the substrate portions through melting and subsequent solidification by cooling of solder disposed between the one of the substrate portions and the lower electrode of the vertical geometry light emitting diode and thereafter, the upper electrode of the vertical geometry light emitting diode may be connected to the other substrate portion through the conductive connecting member through melting and subsequent solidification by cooling of solder disposed between the upper electrode and the conductive connecting member and between the other substrate portion and the conductive connecting member.

As for the vertical geometry light emitting diode package aggregate, a package aggregate having a peripheral slit divided into a plurality of portions and/or at least one peripheral weakened part, surrounding the periphery of each package unit, may be used.

Also, as the vertical geometry light emitting diode package aggregate, a package aggregate having, in the periphery of each package unit, a peripheral opening divided into a plurality of portions by a plurality of leads with one end being connected to the package unit may be used.

The conductive connecting member may be made of a metal and composed of at least one arm connected to the upper electrode of the vertical geometry light emitting diode and a substrate portion-joining part communicated with the arm and joined to the other substrate portion.

The surface of the conductive connecting member is preferably plated with gold and/or silver.

A ribbon-like metal member may be used as the conductive connecting member. The material of the ribbon-like metal member is preferably gold.

The production method of the light emitting device of the present invention may further comprise the step of filling a transparent sealing material in the penetrating opening of the reflector to seal the vertical geometry light emitting diode, after the step of mounting the vertical geometry light emitting diode on one of the substrate portions and connecting the upper electrode of the vertical geometry light emitting diode to the other substrate portion.

BEST MODE FOR CARRYING OUT THE INVENTION

The vertical geometry light emitting diode package aggregate of the present invention is a vertical geometry light emitting diode package aggregate comprising a metal sheet having formed thereon a number of vertical geometry light emitting diode package units, each package unit comprising two or more substrate portions as parts of the metal sheet, which are separated by a slit, and a reflector having a penetrating opening and being adhered to the two or more substrate portions to cover parts of the slit such that the vertical geometry light emitting diode-mounting position is exposed in the inner side of the opening, and the end parts of the slit are exposed in the outer side of the reflector.

Figure 1A:
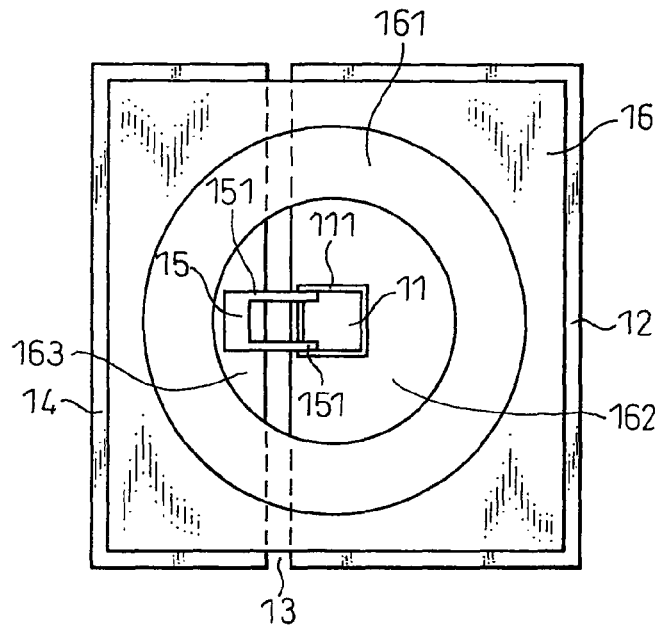
FIGS. 1A to 1C are drawings illustrating a package unit in the vertical geometry light emitting diode package aggregate of the present invention.

Before describing the vertical geometry light emitting diode package aggregate of the present invention in detail, the package unit working out to a unit in producing one light emitting device will be described by referring to FIGS. 1A to 1C. FIG. 1A is a plan view of the package unit having mounted thereon a vertical geometry light emitting diode, FIG. 1B is a cross-sectional view, and FIG. 1C is a bottom view.

Figure 1B:
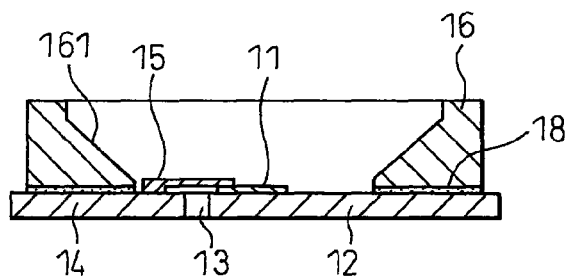
Figure 1C:
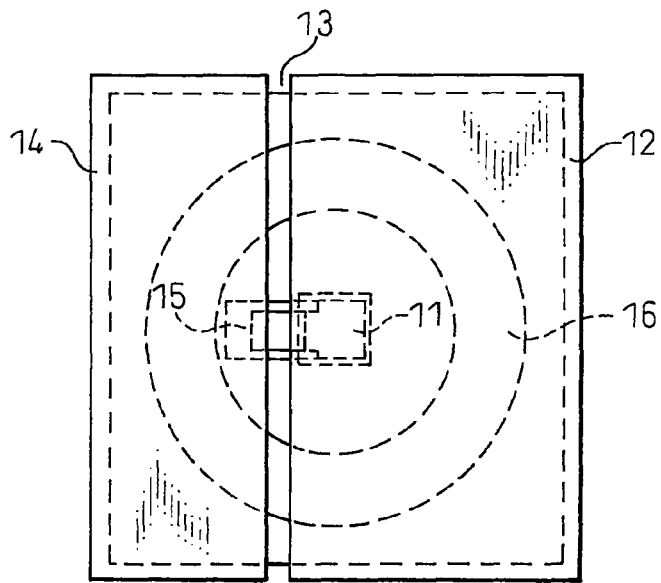

In the example illustrated in FIGS. 1A to 1C, one vertical geometry light emitting diode 11 is mounted on one package unit having a pair of substrate portions 12 and 14. A slit 13 is provided between the substrate portions 12 and 14 to insulate the substrate portions from each other. The vertical geometry light emitting diode 11 is mounted on one substrate portion 12 by joining a lower electrode (not shown) thereof to the substrate portion, while an upper electrode (not shown) is connected to the other substrate portion 14 by using a conductive connecting member 15.

To the substrate portions 12 and 14, a hollow reflector 16 having a penetrating opening provided with an inclined reflecting surface 161 formed to spread upward is coupled with an adhesive 18 (FIG. 1B) so as to surround the region where the vertical geometry light emitting diode 11 is mounted (in the following reference drawings, for the sake of simplification, those corresponding to the adhesive 18 in FIG. 1B are not shown).

The reflector 16 is produced to have such a dimension and a shape as allowing both ends of a slit 13 separating the substrate portions 12 and 14 to be exposed when the reflector is mounted. The reflector 16 is coupled to the substrate portions 12 and 14 by using a silicone resin-based, epoxy resin-based, polyimide resin-based, glass-based or brazing material-based adhesive.

The substrate portions 12 and 14 are separated by the slit 13, nevertheless, are firmly held together by the reflector 16 and the adhesive 18. Therefore, even when individual light emitting devices are cut out from the package aggregate produced by mounting vertical geometric diodes on package units, the integrity thereof is maintained. As the adhesive 18, a thermosetting adhesive mainly composed of a two-pack type epoxy-based resin or an adhesive composed of a silicone-based resin, for example, may be used. In some cases, a glass-based or brazing material-based adhesive may be used. The adhesive can be easily coated on a small-size area, for example, by an automated coating machine.

The shape of the slit 13 that separates the substrate portions 12 and 14 may be linear as illustrated in the drawings or may be changed to an arbitrary shape such as curve, cross, letter T or letter H. The slit 13 can also be filled with an insulating material (not shown).

On the surfaces of the substrate portions 12 and 14, for example, silver plating layers 162 and 163 are applied to the regions corresponding to the inner side of the reflector to efficiently reflect light emitted by the vertical geometry light emitting diode 11.

Figure 2A:
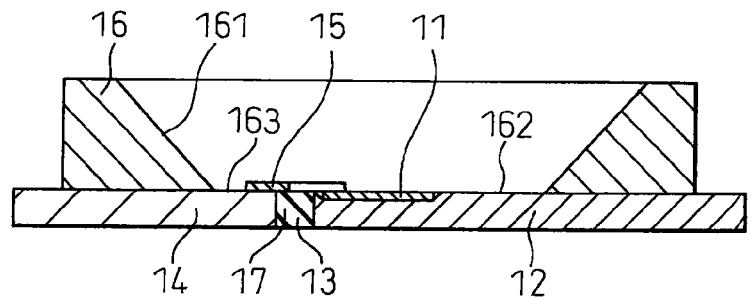
FIGS. 2A to 2C are drawings illustrating another example of the package unit.

Another example of the package unit will be described by referring to FIGS. 2A to 2C. FIG. 2A is a cross-sectional view illustrating a package unit having mounted thereon a vertical geometry light emitting diode, FIG. 2B is a partially enlarged view of FIG. 2A, and FIG. 2C is a plan view of a package unit having mounted thereon a vertical geometry light emitting diode.

Figure 2B:
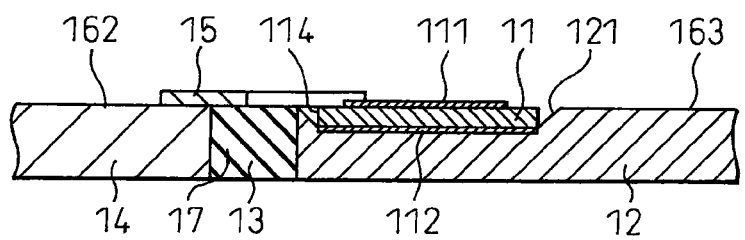
Figure 2C:
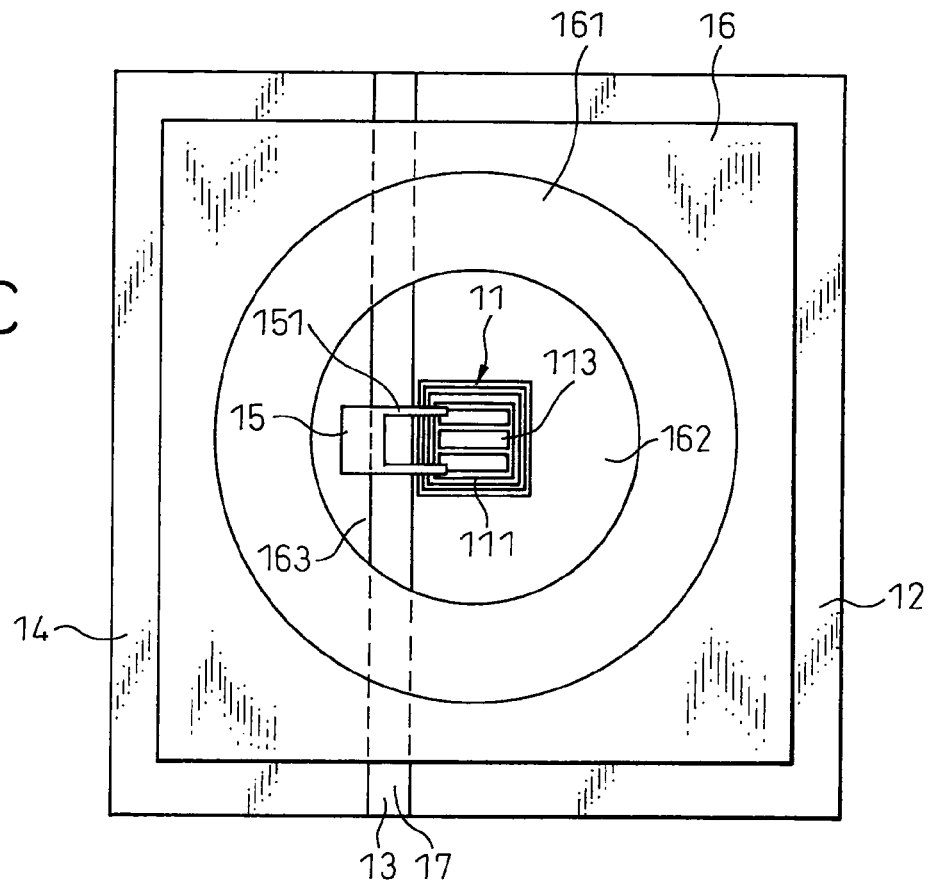

In FIGS. 2A to 2C, the package unit is composed at least of a pair of substrate portions 12 and 14 separated by a slit 13 and a reflector 16 adhesively mounted on the substrate portions 12 and 14 and provided with an inclined reflecting surface 161 formed to spread upward so as to surround the region where a vertical geometry light emitting diode 11 is mounted. The substrate portions 12 and 14 corresponding to parts of a metal sheet constituting the package aggregate are electrically separated by a slit 13. In some cases, the slit 13 may be filled with an insulating material 17.

As the insulating material 17 filled in the slit 13, a ceramic material, a thermosetting resin mainly composed of a one-pack or two-pack epoxy-based resin, or a silicone-based resin, for example, may be used.

In FIG. 2B, a housing recess 121 capable of housing a vertical geometry light emitting diode 11 is formed in the substrate portion 12. The vertical geometry light emitting diode 11 is provided with an upper electrode 111 and a lower electrode 112. In this case, the vertical geometry light emitting diode 11 is joined to the substrate portion 12 at the bottom of the housing recess 121 of the substrate portion 12 through the lower electrode 112. The upper electrode 111 of the vertical geometry light emitting diode 11 is connected to the other substrate portion 14 through a conductive connecting member 15.

Figure 3:
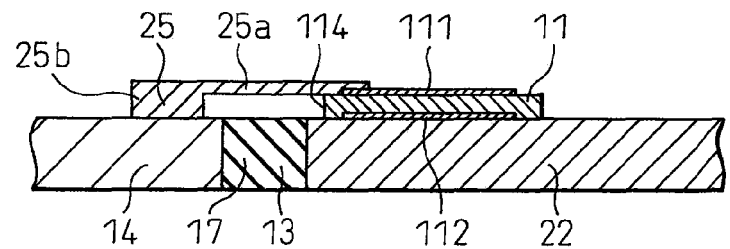
FIG. 3 is a drawing illustrating the connection of the upper electrode of the vertical geometry light emitting diode to the substrate portion by a conductive connecting member.

FIG. 3 is a cross-sectional view illustrating the connection of the upper electrode of the vertical geometry light emitting diode to the substrate portion by a conductive connecting member in a package unit where the vertical geometry light emitting diode is mounted on the substrate portion without using a housing recess. In this example, a housing recess described by referring to FIG. 2B is not provided in the substrate portion 22 having mounted thereon the vertical geometry light emitting diode. In FIG. 2B where a housing recess is provided in one substrate, a flat (without curve in the perpendicular direction) connecting member 15 is used for the connection of the upper electrode of the light emitting diode to the other substrate, whereas in the example of FIG. 3, the connecting member 25 is shaped nearly in the form of letter L, and an arm 25a in the horizontal direction is connected to the upper electrode 111 of the vertical geometry light emitting diode 11, while a substrate portion-joining part 25b is connected to the upper surface of the substrate portion 14. The size of the vertical geometry light emitting diode 11 is about 1.0 mm×1.0 mm and therefore, it is in many cases preferred to produce a connecting member 25 having a letter L shape illustrated in FIG. 3 or having a curve described later rather than to form a housing recess in one substrate portion.

Figure 4A:
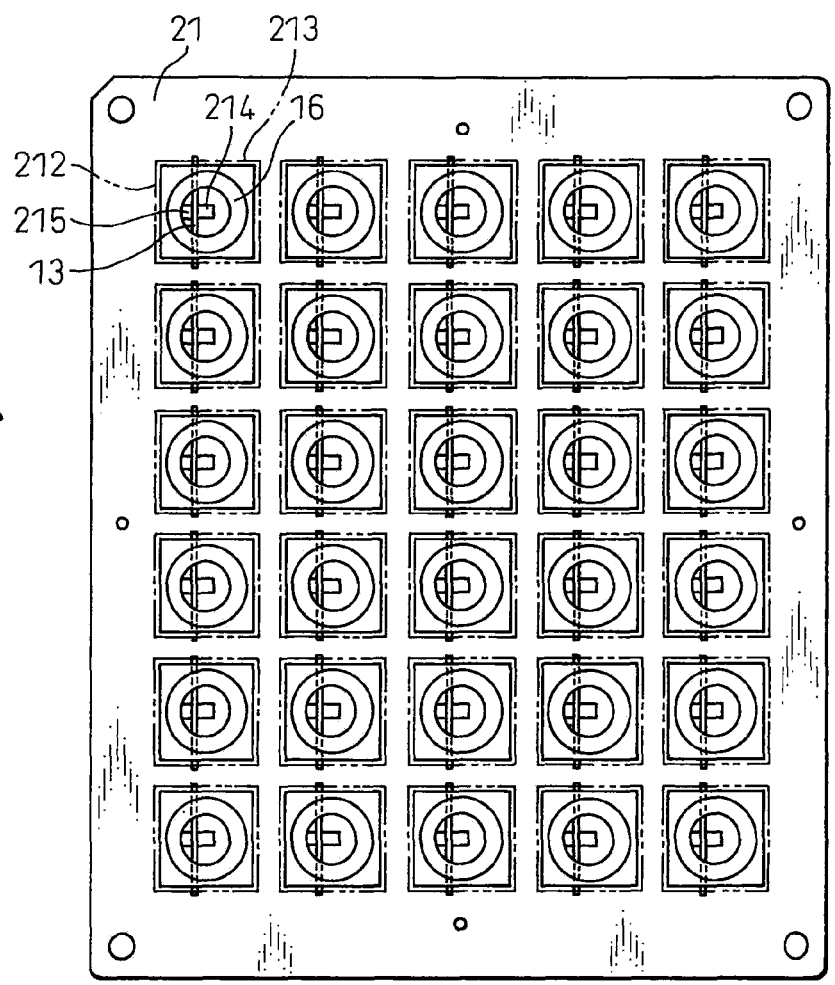
FIGS. 4A and 4B are schematic drawings illustrating the vertical geometry light emitting diode package aggregate of the present invention.
Figure 4B:
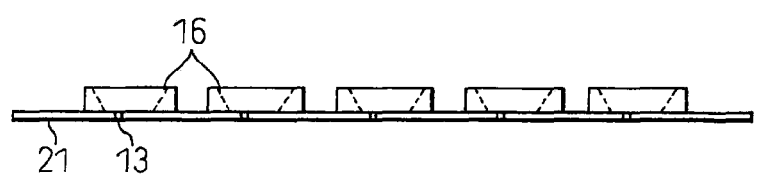

FIGS. 4A and 4B are a plan view and a side view, respectively, which illustrate the vertical geometry light emitting diode package aggregate of the present invention.

In the aggregate of vertical geometry light emitting diode packages disposed in a matrix configuration on one metal sheet 21 illustrated in FIGS. 4A and 4B, the positions of the slits 13 of individual packages constituting the aggregate are offset from the centers of the openings of the reflectors 16 (also in FIGS. 1A to 1C and FIGS. 2A to 2C, slits 13 offset from the center of the opening of the reflectors 16 are shown). As clearly illustrated in FIGS. 1A to 1C and FIGS. 2A to 2C, this slit arrangement enables disposing the vertical geometry light emitting diode 11 at the center of the opening of the reflectors 16 and efficiently radiating light to the outside by the reflectors 16.

In FIG. 4A, a vertical geometry light emitting diode-mounting portion 214 in one substrate portion of each package unit and a conductive connecting member-mounting portion 215 in the other substrate portion are illustrated.

In the vertical geometry light emitting diode package aggregate of FIGS. 4A and 4B, vertical geometry light emitting diodes (not shown) are mounted on respective package units and the metal sheet 21 is then cut along cutting lines 212 and 213, whereby the respective packages are separated. For this purpose, the slits 13 are formed to extend to the cutting lines 213 or to a position on the outside of the cutting line. Cutting can be performed, for example, by a cutter or by pressing with a die, and the packages can be cut individually, every each row, or simultaneously all at once.

Figure 5:
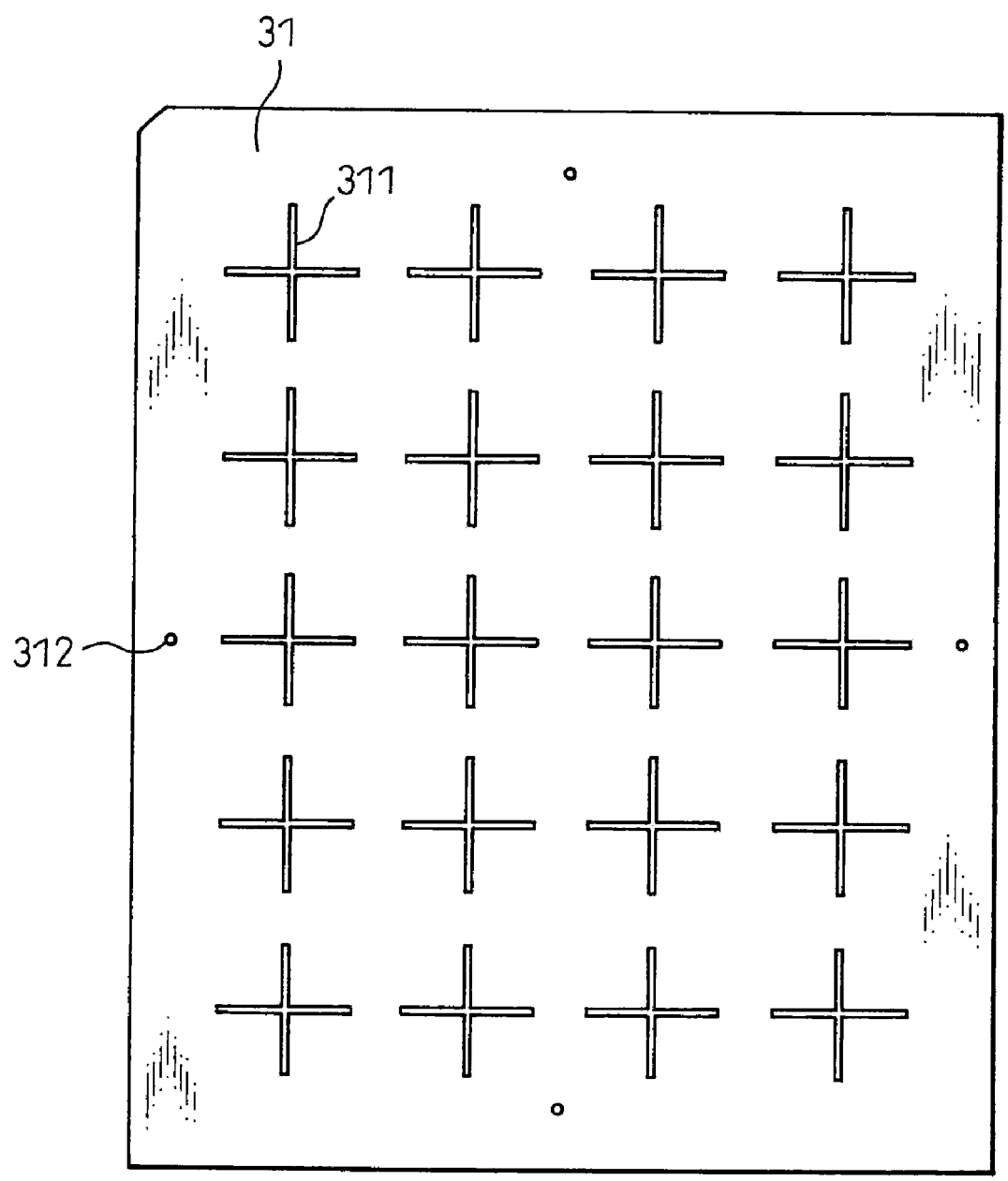
FIG. 5 is a drawing illustrating an example of the metal sheet having provided therein slits for use in the vertical geometry light emitting diode package aggregate of the present invention.

FIG. 5 is a plan view illustrating an example of the metal sheet used in the vertical geometry light emitting diode package aggregate of the present invention. In FIG. 5, a matrix of slits 311 and positioning holes 312 are provided in the metal sheet 31. In this example, the crossing slits 311 are formed. An insulating material may be filled in the slits 311. The metal sheet 31 of FIG. 5 can be used for producing a vertical geometry light emitting diode package aggregate usable for the production of lighting devices with high illuminance by arranging two vertical geometry light emitting diodes in parallel, by disposing a vertical geometry light emitting diode on, for example, one of the substrate portions separated by the slit in the longitudinal direction of the crossing slits 311, while connecting the upper electrode to the other substrate portion.

Figure 6:
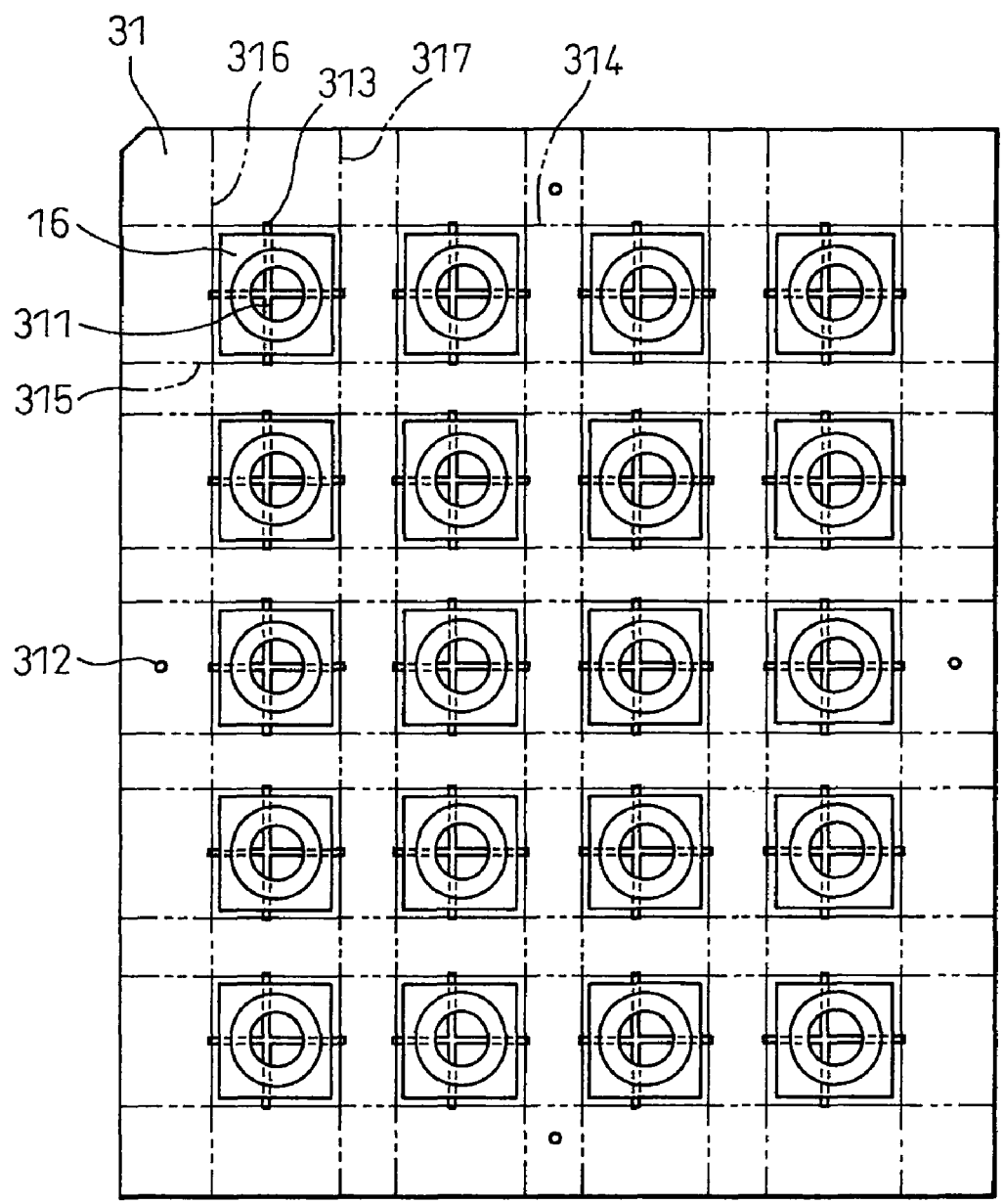
FIG. 6 is a schematic drawing illustrating the vertical geometry light emitting diode package aggregate where reflectors are mounted on the metal sheet having provided therein slits of FIG. 5.

FIG. 6 is a plan view illustrating the vertical geometry light emitting diode package aggregate where reflectors 16 are mounted on the metal sheet 31 of FIG. 5. In FIG. 6, the reflectors 16 are mounted on the metal sheet 31 such that the centers of the openings of the reflectors are offset from the centers of the crossing slits 311 (the intersections between the respective slits in the longitudinal direction and the respective slits in the transverse direction).

Also in the vertical geometry light emitting diode package aggregate of FIG. 6, similarly to the package aggregate described above by referring to FIGS. 4A and 4B, vertical geometry light emitting diodes (not shown) are mounted on the respective package units and the metal sheet 31 is then cut, for example, along cutting lines 314, 315, 316 and 317, whereby the respective packages are separated from each other. For this purpose, the crossing slits 311 are formed to extend to respective cutting lines 314, 315, 316 and 317 or to positions outside of the respective cutting line.

An insulating material may be previously filled in the crossing slits 311. Further, in some cases, the intersection between the slit in the longitudinal direction and the slit in the transverse direction of the crossing slits 311 may be made to coincide with the center of the opening of the reflector 16.

In the present invention, a single package or a group of a predetermined number of packages can also be obtained by cutting a required number of packages from a package aggregate having no vertical geometry light emitting diodes mounted. This example will be described below.

Figure 7A:
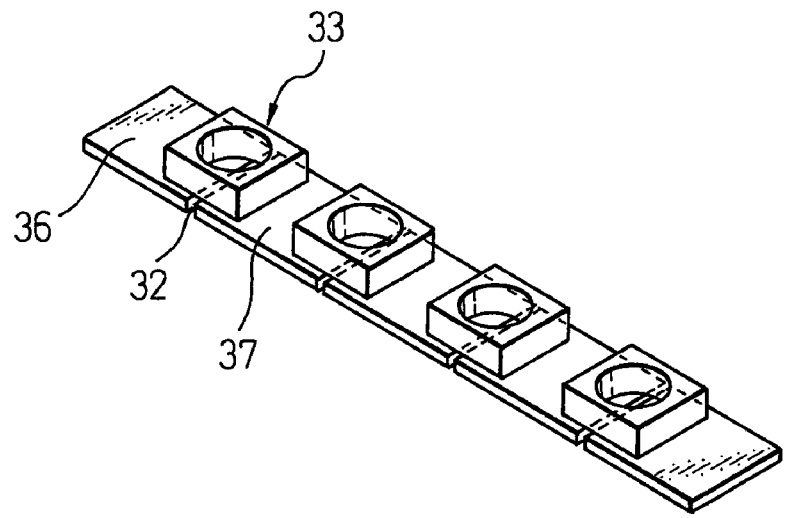
FIGS. 7A to 7C are drawings schematically illustrating the package in a single row obtained by cutting a package aggregate of matrix type.
Figure 7B:
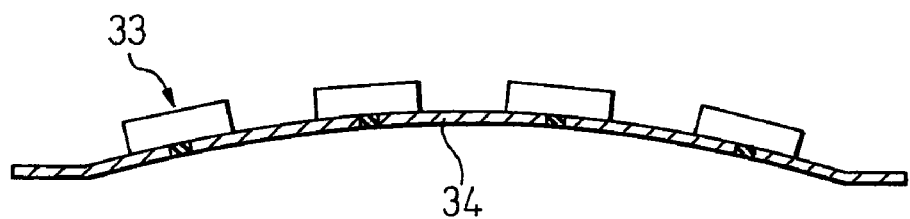
Figure 7C:
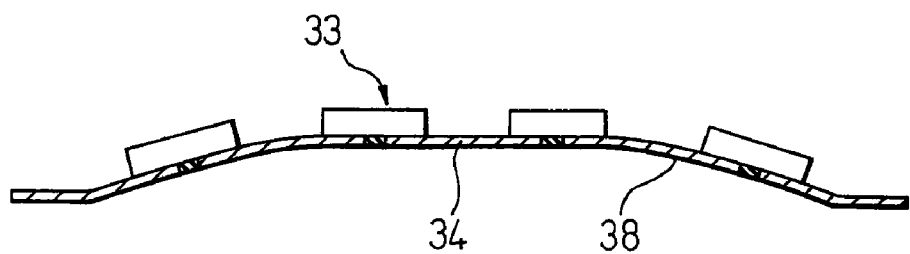

FIGS. 7A to 7C are drawings illustrating a package in a single row obtained by cutting a package aggregate of matrix type. FIG. 7A is an example where four packages are linearly connected, FIG. 7B is an example where four packages are present on a metal sheet curved as a whole, and FIG. 7C is an example where four packages are present on a metal sheet having a curved part and a linear part.

FIG. 7A illustrates an aggregate of four vertical geometry light emitting diode packages 53 arrayed in a single row obtained by cutting a metal sheet having reflectors mounted thereon. In this example, the slit 32 is linear and establishes electrical insulation between two substrate portions 36 and 37 in one package. In the vertical geometry light emitting diode package aggregate of this drawing, four vertical geometry light emitting diodes are connected in series when they are mounted. This aggregate of four vertical geometry light emitting diodes can be utilized as a light emitting device that is long from side to side.

FIG. 7B illustrates an aggregate where four packages 33 are arrayed on a series of five substrate portions 34 curved as a whole. FIG. 7C illustrates an aggregate having four packages 53 and five substrate portions, the substrate portions being arranged in series so as to have curved parts 38 having an arbitrary curved profile are at the left and right sides and the linear center part.

In the present invention, the array of substrate portions described with reference to FIGS. 7B and 7C can be modified by arbitrarily changing the curvature of the curve or the curvature angle of the curved part 55. Furthermore, other than these, an embodiment where the array of substrate portions is formed in a semispherical shape or modified into a desired shape may also be employed.

In the vertical geometry light emitting diode package aggregate of the present invention, a peripheral slit divided into a plurality of portions and/or at least one peripheral weakened part may be provided in the periphery of each package unit.

Figure 8:
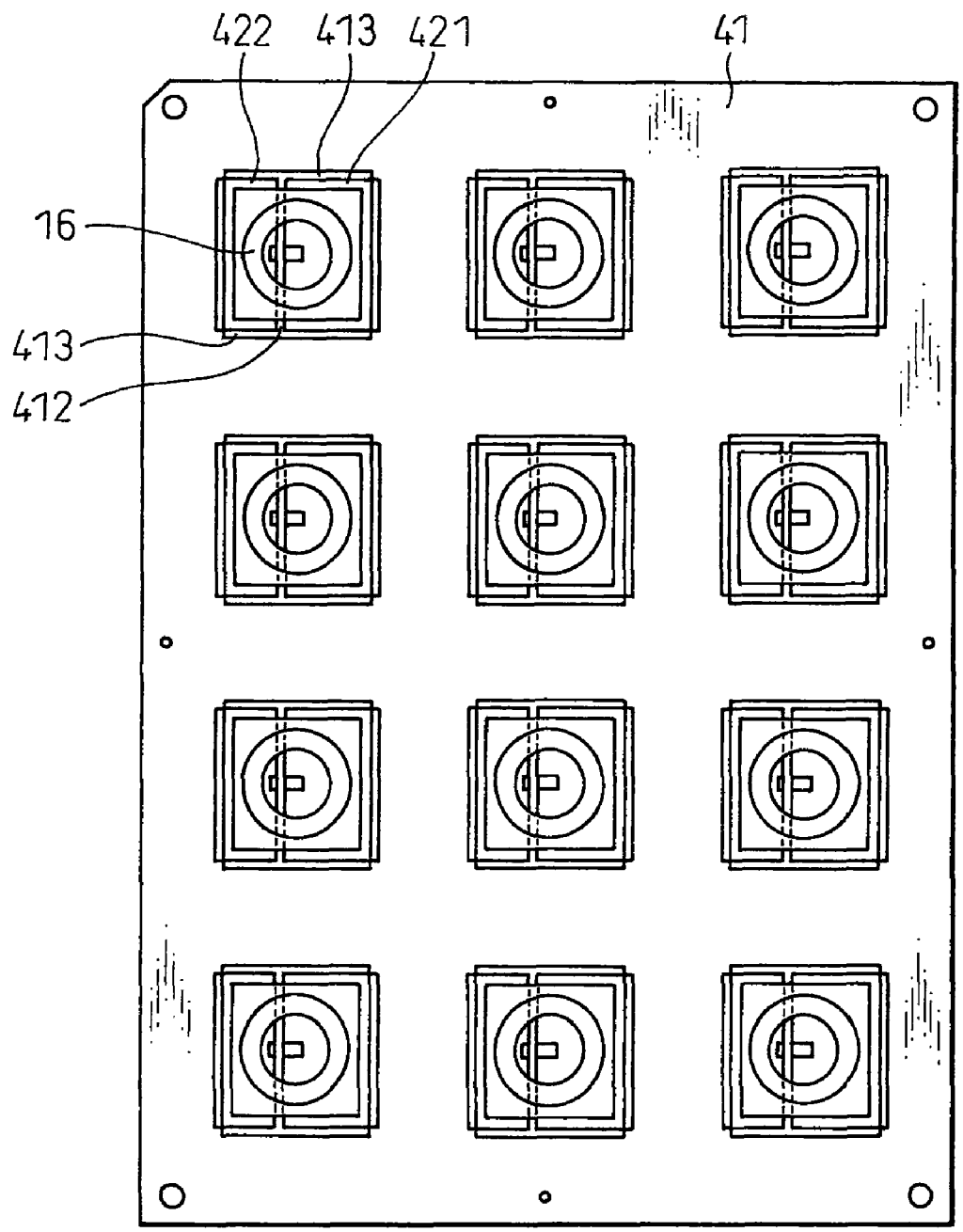
FIG. 8 is a schematic drawing illustrating the vertical geometry light emitting diode package aggregate where a plurality of peripheral slits are provided in the periphery of each package unit.

FIG. 8 illustrates an example of the vertical geometry light emitting diode package aggregate where a peripheral slit divided into a plurality of portions is provided in the periphery of each package unit. The package aggregate of this drawing consists of 12 package units disposed in a matrix configuration on a metal sheet 41. In the periphery of each package unit, four peripheral slits 413 formed discontinuously are provided, and an internal slit 412 provided to be offset from the center of the opening of the reflector 16 is connected to the peripheral slits 413. The reflector 16 is adhered to two substrate portions 421 and 422 positioned to sandwich the internal slit 412 of each package unit.

Figure 9:
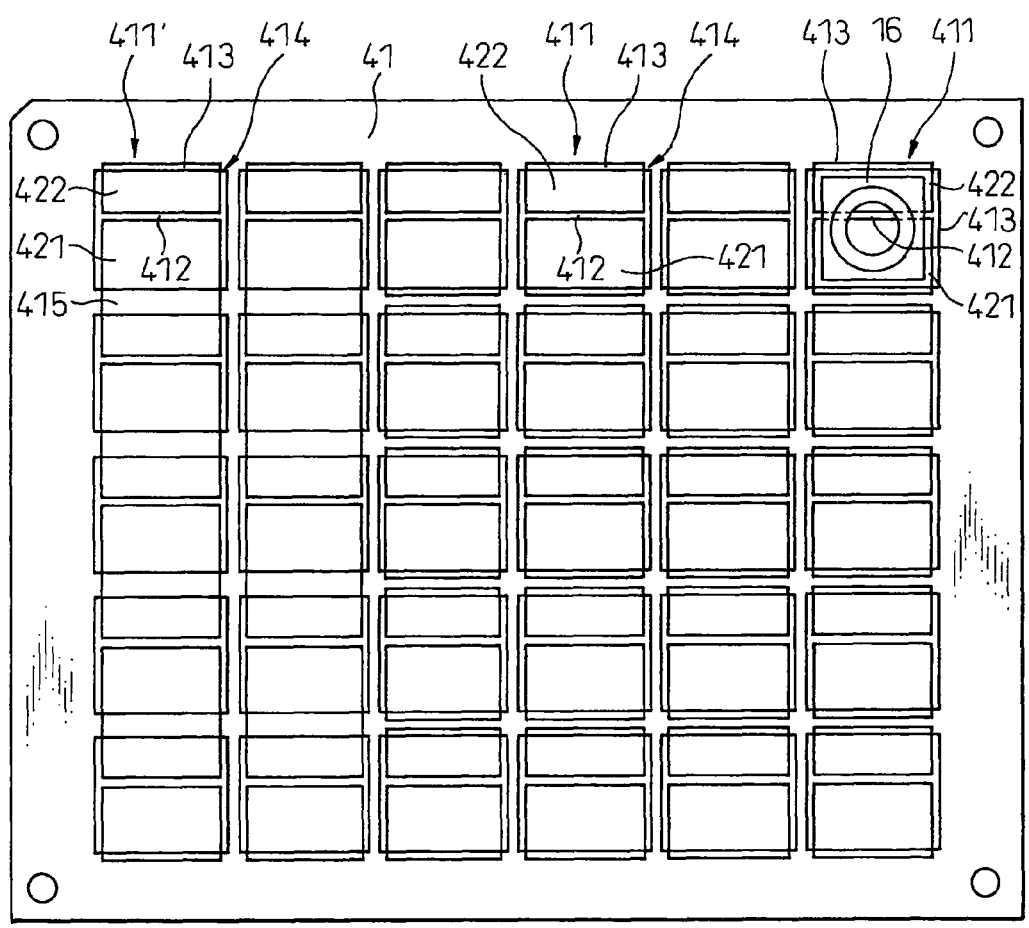
FIG. 9 is a schematic drawing illustrating another example of the vertical geometry light emitting diode package aggregate where a plurality of peripheral slits are provided in the periphery of each package unit.

FIG. 9 illustrates another example of the vertical geometry light emitting diode package aggregate of the present invention. In the package aggregate of this example, package units 411 with the periphery being surrounded by four peripheral slits 413 are formed in a matrix configuration on a metal sheet 41 (package units in four longitudinal rows on the right side). The package unit 411 has an internal slit 412 at the position offset from the center of the opening of the reflector 16 (for the sake of simplification, illustrated only in the package unit on the right upper corner). The internal slit 412 is connected to the peripheral slits 413. The reflector 16 is adhered to two substrate portions 421 and 422 positioned to sandwich the internal slit 412 of each package unit.

In FIG. 9, for the sake of simplification, two examples are illustrated, and the package units of this drawing differ in the peripheral slits between four right rows and two left rows, In the package unit 411 of four right rows, the entire periphery thereof is surrounded by four individual peripheral slits 413, whereas in the package unit 411' of two left rows, two or three sides are surrounded by individual peripheral slits 413, and a peripheral slit 415 is shared by longitudinally adjacent package units. In FIG. 9, the shared slit 415 is drawn with a wide width but in practice, may have the same width as a single individual slit 413.

Figure 10:
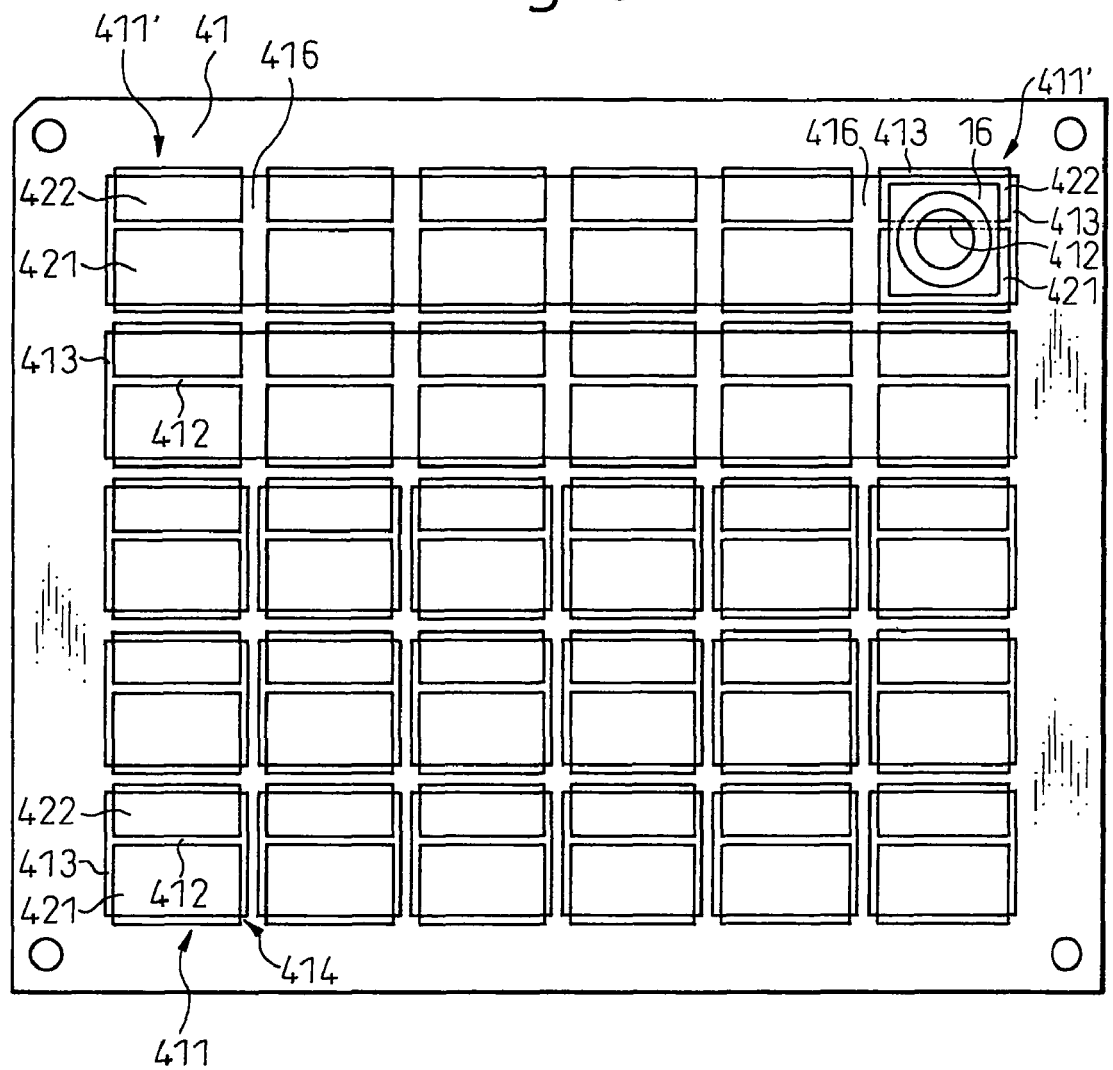
FIG. 10 is a schematic drawing illustrating another example of the vertical geometry light emitting diode package aggregate where a plurality of peripheral slits are provided in the periphery of each package unit.

FIG. 10 illustrates still another example of the vertical geometry light emitting diode package aggregate of the present invention. The package unit of this example is different from the package unit described with reference to FIG. 9 in that the package units differ from each other between the two top rows and the three bottom rows. In other words, in the package units 411' of the two top rows, two or three sides thereof are surrounded by individual peripheral slits 413 and a peripheral slit 416 is shared by transversely adjacent package units, whereas in the package units 411 of three bottom rows, the entire periphery of each unit is surrounded by four individual peripheral slits 413. Also in this case, the shared slits 416 in the two top rows may be made to have the same width as the individual slits 413, whereby the required area in the transverse direction of the metal sheet 41 can be reduced.

Figure 11A:
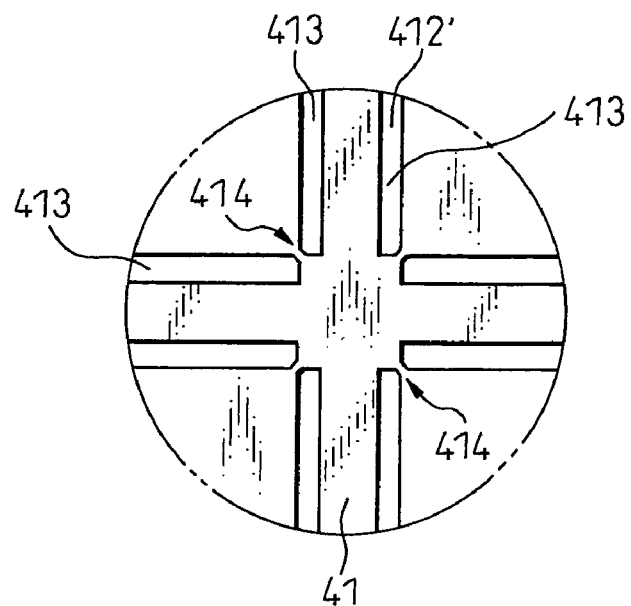
FIGS. 11A and 11B are schematic drawings illustrating peripheral slits of a package unit.
Figure 11B:
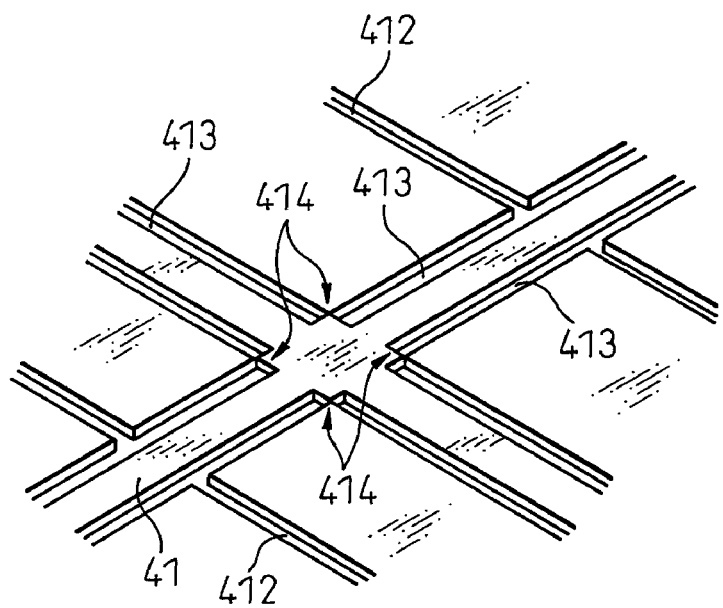

In the vertical geometry light emitting diode package aggregate of the present invention where peripheral slits surrounding each package unit are provided, a minute link 414 is present between end parts of adjacent peripheral slits 413, as illustrated in FIGS. 11A and 11B, and when a light emitting device (not shown) is completed for each package unit, the light emitting device can be separated from the metal sheet 41 by slight pressing. Also in the case of using a shared slit 415 or 416 illustrated in FIGS. 9 and 10, a minute link can be provided between the end parts of the shared slit 415 (or 416) and the peripheral slit 413 which are adjacent to each other.

In place of the peripheral slit surrounding each package unit, a peripheral weakened part may be used. The peripheral weakened part may be provided, as a recess formed on the metal sheet, in a dotted or discontinuous line configuration, or one continuous line configuration, for example, at the position of cutting lines 212 and 213 in the periphery of the package unit illustrated in FIG. 4A. The recess must be formed to a depth allowing the package unit to be separated from the metal sheet by a slight pressing force without using a special machine. Alternatively, a number of short slits may be provided in succession to form the weakened part. The peripheral weakened part may also be used in combination with the peripheral slit.

In the vertical geometry light emitting diode package aggregate of the present invention, a peripheral opening divided into a plurality of portions by a plurality of leads with one end being connected to the package unit may also be provided in the periphery of each package unit. In this package aggregate, the leads as parts of the metal sheet play the role of holding the package unit.

Figure 12:
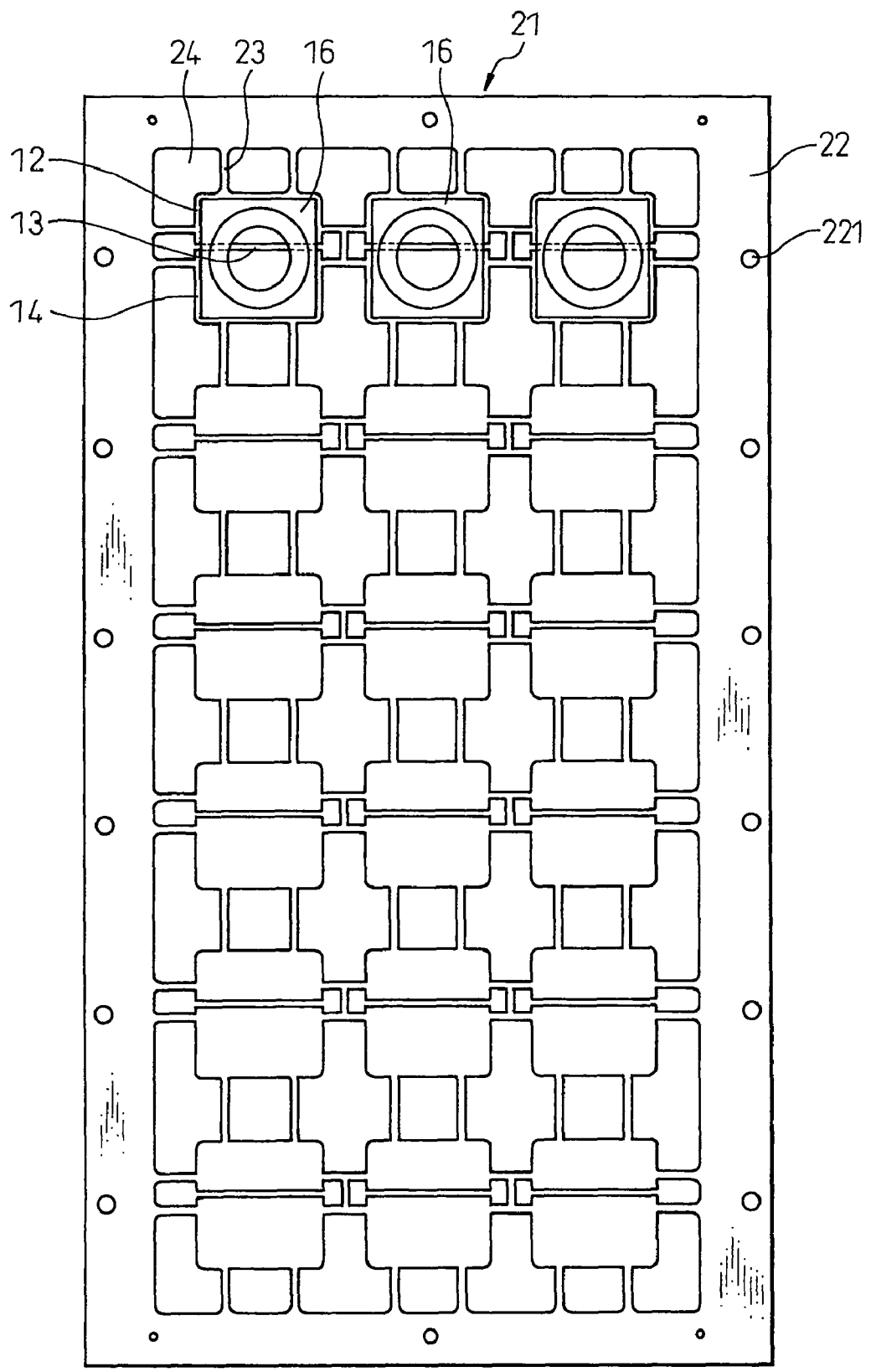
FIG. 12 is a schematic drawing illustrating the vertical geometry light emitting diode package aggregate where a peripheral opening surrounding each package unit is provided.

FIG. 12 illustrates an example of the vertical geometry light emitting diode package aggregate where such a peripheral opening is provided for each package unit. In the package aggregate of this drawing, a number of package units each comprising a pair of substrate portions 12 and 14 separated by a slit 13 and a reflector 16 are formed inside of a frame 22 of a metal sheet 21. The reflector 16 (for the sake of simplification, in FIG. 12, illustrated only in the top three package units) of each package unit is adhered to the substrate portions 12 and 14 with an adhesive. The substrate portions 12 and 14 of each package unit are connected to the frame 22 or the substrate portion of the adjacent package unit by leads 23 provided as weakened members. The peripheries of the substrate portions 12 and 14 are surrounded by peripheral opening 24 divided into a plurality of portions by the leads 23. In this way, the peripheral opening 24 borders the lead 23, frame 22 and substrate portions 12 and 14. Incidentally, in the frame 22, a plurality of holes 221 for positioning are provided.

Figure 13:
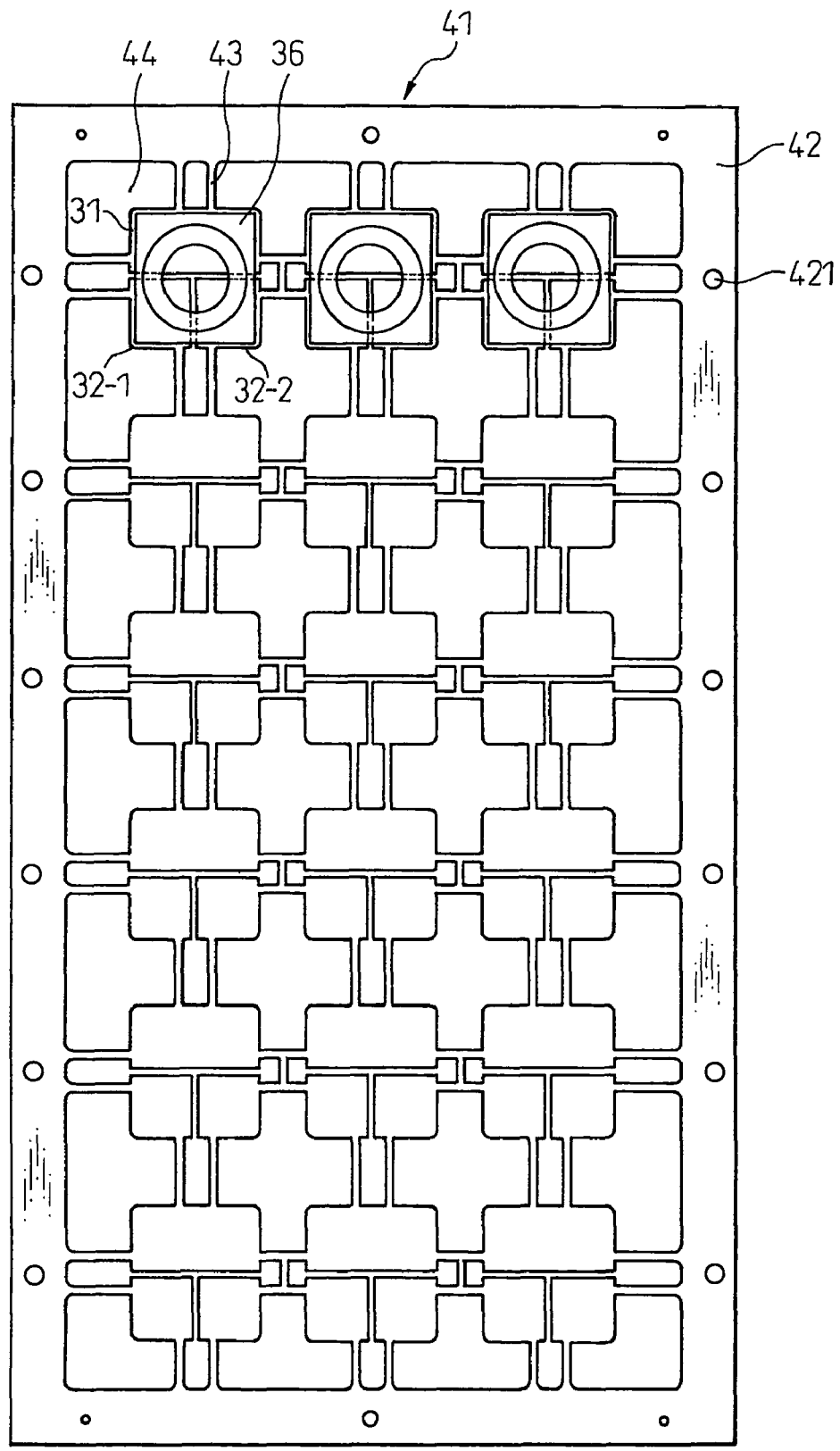
FIG. 13 is a schematic drawing illustrating another example of the vertical geometry light emitting diode package aggregate where a peripheral opening surrounding each package unit is provided.

Another example of the vertical geometry light emitting diode package aggregate of the present invention where a peripheral opening divided into a plurality portions by a plurality of leads is provided in the periphery of each package unit will be described below by referring to FIG. 13. In the package aggregate of this drawing, a number of package units each comprising three substrate portions 31, 32-1 and 32-2 separated by slits and a reflector 36 are formed inside of a frame 42 of a metal sheet 41. The reflector 36 (for the sake of simplification, in FIG. 13, illustrated only in the top three package units) of each package unit is adhered to the substrate portions 31, 32-1 and 32-2 with an adhesive. The peripheries of the substrate portions 31, 32-1 and 32-2 are surrounded by a peripheral opening 44 divided into a plurality of portions by leads 43. In the frame 42, a plurality of holes 421 for positioning are provided.

Figure 14:
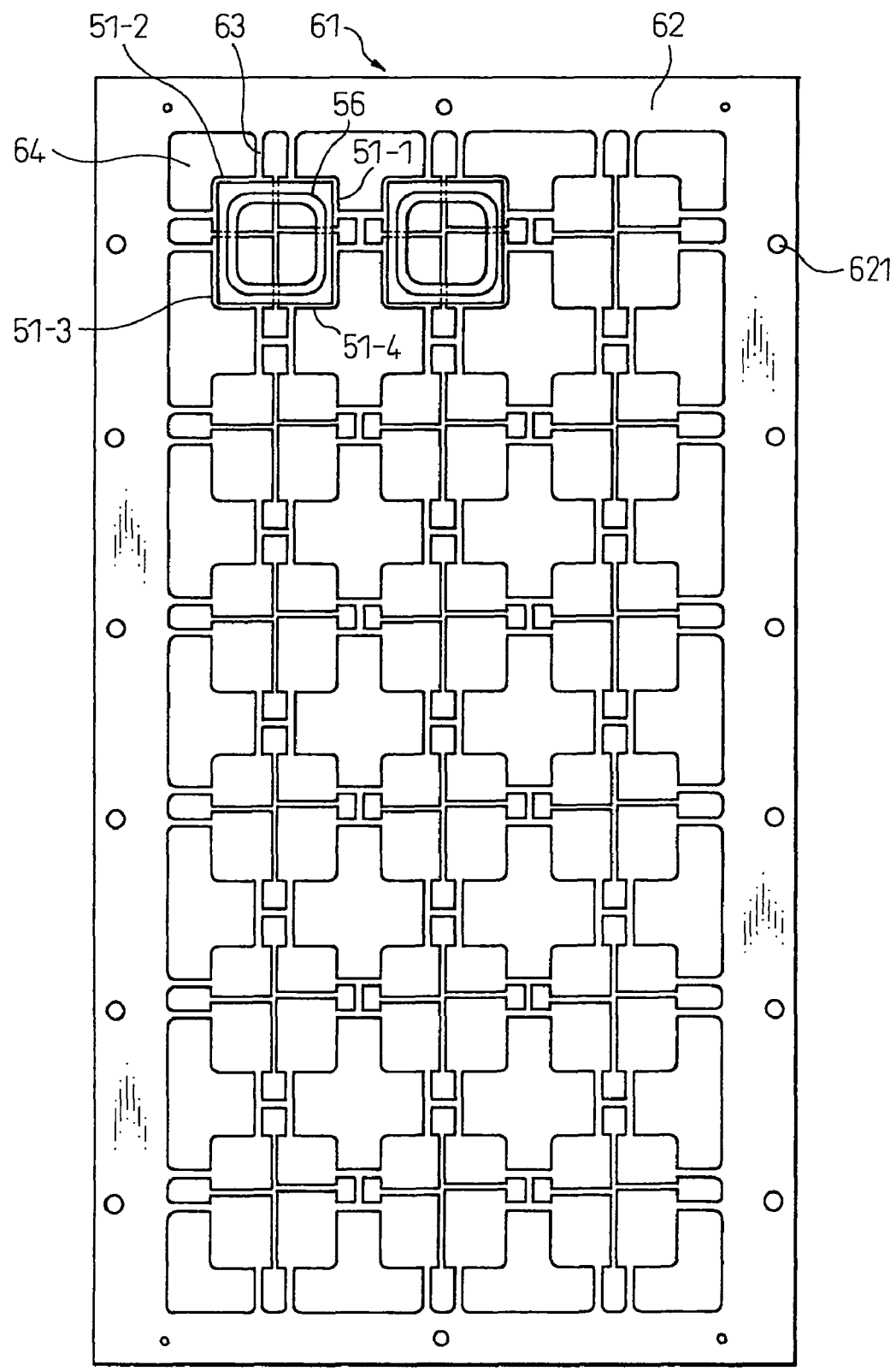
FIG. 14 is a schematic drawing illustrating another example of the vertical geometry light emitting diode package aggregate where a peripheral opening surrounding each package unit is provided.

Still another example of the vertical geometry light emitting diode package aggregate of the present invention where a similar peripheral opening is provided will be described below by referring to FIG. 14. In the package aggregate of this drawing, a number of package units each comprising four substrate portions 51-1, 51-2, 51-3 and 51-4 separated by slits and a reflector 56 are formed inside of a frame 62 of a metal sheet 61. The reflector 56 (for the sake of simplification, in FIG. 14, illustrated only in the left upper two package units) of each package unit is adhered to the substrate portions 51-1, 51-2, 51-3 and 51-4 with an adhesive. The peripheries of the substrate portions 51-1, 51-2, 51-3 and 51-4 are surrounded by a peripheral opening 64 divided into a plurality of portions by leads 63. In the frame 62, a plurality of holes 621 for positioning are provided.

Figure 15:
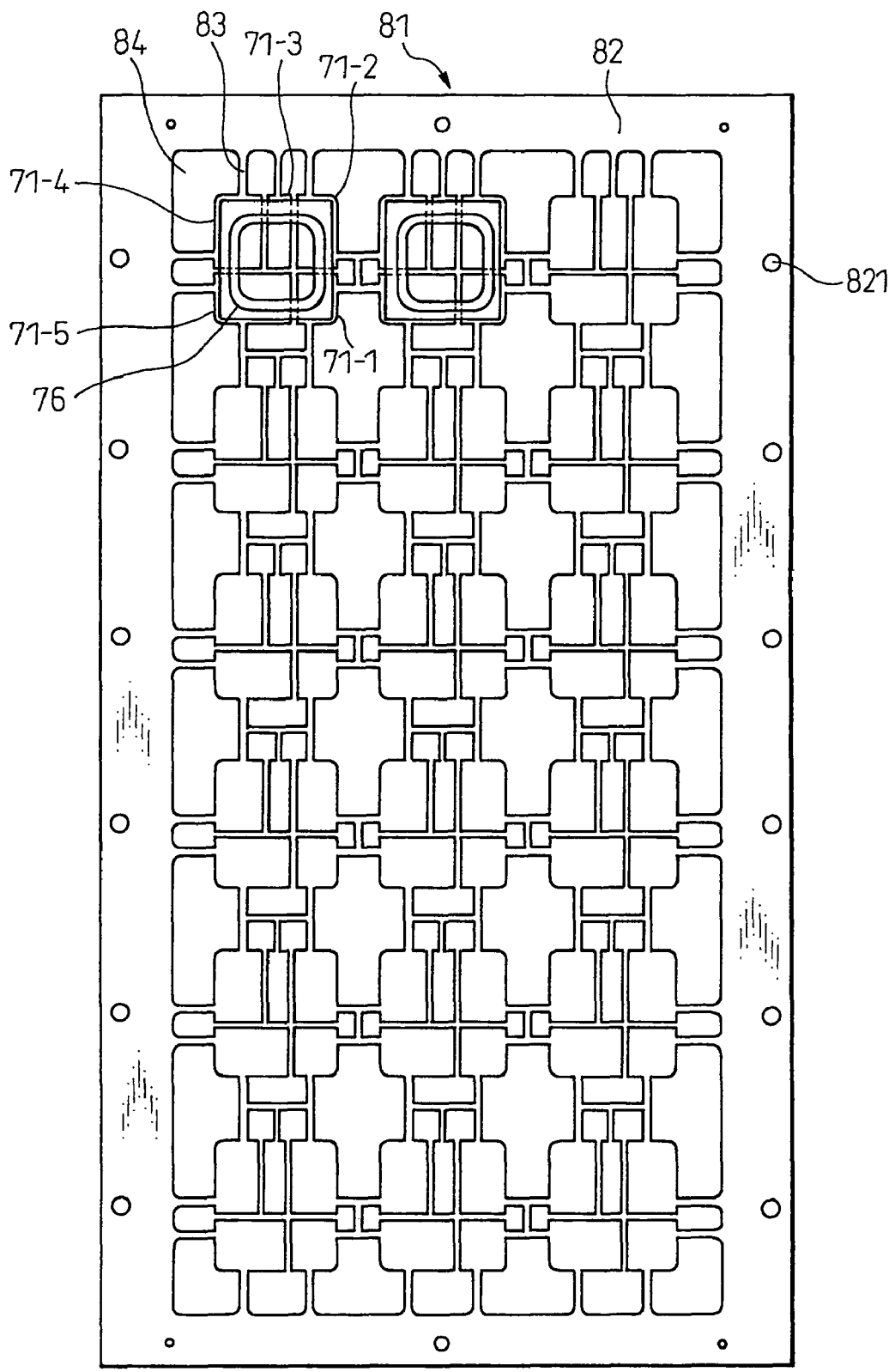
FIG. 15 is a schematic drawing illustrating another example of the vertical geometry light emitting diode package aggregate where a peripheral opening surrounding each package unit is provided.

Another example of the vertical geometry light emitting diode package aggregate of the present invention where a similar peripheral opening is provided will be described below by referring to FIG. 15. In the package aggregate of this drawing, a number of package units each comprising five substrate portions 71-1, 71-2, 71-3, 71-4 and 71-5 separated by slits and a reflector 76 are formed inside of a frame 82 of a metal sheet 81. The reflector 76 (for the sake of simplification, in FIG. 15, illustrated only in the left upper two package units) of each package unit is adhered to the substrate portions 71-1, 71-2, 71-3, 71-4 and 71-5 with an adhesive. The peripheries of the substrate portions 71-1, 71-2, 71-3, 71-4 and 71-5 are surrounded by a peripheral opening 84 divided into a plurality of portions by leads 83. In the frame 82, a plurality of holes 821 for positioning are provided.

In each of the above-described vertical geometry light emitting diode package aggregates of the present invention where a peripheral opening is provided in the periphery of each package unit, the leads 23, 43, 63 or 83 are thinly formed to provide a large opening ratio of the peripheral opening 24, 44, 64 or 84, and are provided only in the minimum number of portions necessary for preventing the members connected by the leads 23, 43, 63 or 83 from falling apart. Accordingly, the light emitting devices produced later by mounting vertical geometry light emitting diodes on respective package units can be easily separated from the package aggregate.

Each of the peripheral openings 24, 44, 64 and 84 provided in the peripheries of the substrate portions 12 and 14 can have an opening ratio of 25 to 50%, preferably from 30 to 45%, relative to the metal sheet 21, 41, 61 and 81. By increasing the opening ratio, the heat capacity of the metal sheet 21, 41, 61 or 81 itself can be made small. Accordingly, an adverse effect of heat on the vertical geometry light emitting diode can be eliminated or reduced, due to the small heat capacity of the package aggregate, even when a heat treatment is performed in a reflow furnace or the like in the process of producing a light emitting device by mounting a vertical geometry light emitting diode on the package aggregate.

In the vertical geometry light emitting diode package aggregate of the present invention, for the metal sheet 21, 31, 41, 61 or 81, a material having desired properties can be selected by taking into consideration the change of strength with age of the light emitting device produced using the package aggregate, and the electrical resistance and heat dissipation property when a large current (for example, 350 mA or more) is passed. In general, the material of the metal sheet may be copper, a copper alloy, aluminum, an aluminum alloy, iron, or an iron alloy. The material of the metal sheet is preferably copper, a copper alloy, aluminum or an aluminum alloy.

A plating layer (not shown) of at least one metal of silver, gold and nickel may be formed on the surface of the metal sheet 21, 31, 41, 61 or 81, where a vertical geometry light emitting diode is mounted. This plating layer reflects light emitted from the vertical geometry light emitting diode mounted on each package unit and thereby contributes to efficient radiation of the light to the outside. The plating layer also makes it easy to perform joining thereof to the lower electrode of the vertical geometry light emitting diode mounted on the substrate portion of each package unit obtained from the metal sheet or to the conductive connecting member, by using a solder material. Furthermore, the silver or gold plating layer also has an effect of decreasing the electrical resistance in the joining parts thereof to the lower electrode of the light emitting diode and to the electrically conductive connecting member and raising the heat dissipation property. The plating layer can be formed at a necessary portion of the metal sheet or in some cases, may be formed on the entire surface of the metal sheet.

The reflector 16 for use in the vertical geometry light emitting diode package aggregate of the present invention is produced from a material that reflects light, for example, an alumina-based ceramic or a combined alumina and glass-based ceramic. If desired, a reflection film, for example, a film formed from a gold or silver plating layer, may be provided on the reflecting surface 161 of the reflector, so that the light from the vertical geometry light emitting diode can be efficiently reflected. The reflector 16 can also be produced by plating or coating a film of gold, silver, aluminum or the like on a synthetic resin member.

Each package unit of the package aggregate of the present invention may contain a predetermined number of vertical geometry light emitting diodes according to the number of substrate portions. For example, on a package unit comprising n substrate portions (where, n=1, 2, 3, ... ), n−1 vertical geometry light emitting diodes can be mounted. In the case where the number n of substrate portions is large, the number of vertical geometry light emitting diodes can be fewer than n−1. It is preferred that the reflector has a nearly circular opening in the case of having one or two vertical geometry light emitting diodes in the package unit, or has a nearly square opening in the case of having three or more diodes. As the number of vertical geometry light emitting diodes in a single package unit increases, it is advantageous to make the shape of the reflecting part (opening) of the reflector square than circular so as to have a higher space factor.

The substrate portions 12 and 14 and the reflector 16 can have a circular, quadrate, rectangular or oval shape or the like as viewed from above (shape seen in the plan views of FIGS. 1A and 2C).

The vertical geometry light emitting diode package aggregate of the present invention can be produced by a method comprising a step of forming a slit separating the substrate portions of each package unit on the metal sheet in correspondence to the position where each of the vertical geometry light emitting diodes arrayed, for example, in a single row or a plurality of rows is mounted, and a step of mounting individual reflectors each covering parts of the slit on the metal sheet such that the vertical geometry light emitting diode-mounting position is exposed in the inner side of the opening and the end parts of the slit are exposed.

The slit separating the substrate portions of each package unit may by filled with an insulating material before the mounting of the reflector.

In the case of using a package aggregate having a peripheral slit divided into a plurality of portions surrounding the periphery of each package unit, the peripheral slit can be formed simultaneously with the formation of the slit (internal slit) separating the substrate portions of each package unit.

In the case of using a package aggregate having at least one peripheral weakened part surrounding the periphery of each package unit, the peripheral weakened part can be formed simultaneously with, before or after the formation of the slit (internal slit) separating the substrate portions of each package unit.

The machining for preparing a metal sheet of the package aggregate of the present invention may be performed, for example, by a press molding process.

In the case of forming a plating layer on the surface of the metal sheet, the plating layer is preferably formed before mounting the reflector on the metal sheet.

The method for producing a light emitting device having a vertical geometry light emitting diode as a light source by using the vertical geometry light emitting diode package aggregate of the present invention will now be described below.

In this method, a vertical geometry light emitting diode is mounted by joining its lower electrode to one substrate portion in each package unit of the vertical geometry light emitting diode package aggregate produced as described above, and the upper electrode of the vertical geometry light emitting diode mounted on the one substrate portion is joined to the substrate portion different from that substrate portion by using a conductive connecting member. In this way, a light emitting device as described by referring to FIGS. 1A to 1C, FIGS. 2A to 2C and FIG. 3 where a vertical geometry light emitting diode is mounted on each package unit of the vertical geometry light emitting diode aggregate is obtained.

Mounting of a vertical geometry light emitting diode on one substrate portion and connection of the upper electrode of the vertical geometry light emitting diode to a different substrate portion may be performed simultaneously or separately.

In the case of performing these simultaneously, solder is disposed on a predetermined place of one substrate portion and the lower electrode is put into contact with the solder, thereby placing the vertical geometry light emitting diode on the one substrate portion. Solder is disposed on a predetermined place of the upper electrode of the vertical geometry light emitting diode and a predetermined place of another substrate portion, and a conductive connecting member is disposed, with the end parts thereof being contacted with the solder. Thereafter, the solder is melted, then cooled and solidified, whereby mounting of the vertical geometry light emitting diode on the one substrate portion and connection of the upper electrode of the vertical geometry light emitting diode to the another substrate portion are simultaneously performed.

In the case of performing the mounting and the connection separately, solder is disposed on a predetermined place of one substrate portion and the lower electrode is put into contact with the solder, thereby placing the vertical geometry light emitting diode on the one substrate portion. The solder is then melted, cooled and solidified to mount the vertical geometry light emitting diode on the one substrate portion. Thereafter, solder is disposed on a predetermined place of the upper electrode of the vertical geometry light emitting diode and a predetermined place of another substrate portion, after which a conductive connecting member is disposed, with the end parts thereof being contacted with the solder, and the solder is melted, cooled and solidified to connect the upper electrode of the vertical geometry light emitting diode to the another substrate portion.

In the light emitting device thus obtained, the vertical geometry light emitting diode 11 is connected to one substrate portion 12 via the lower electrode 112, and is connected to another substrate portion 14 through the upper electrode 111 and the conductive connecting member 15.

Since the substrates portions 12 and 14 are made of a metal, electrical power can be supplied to the vertical geometry light emitting diode 11 by connecting those substrate portions to a power supply with wiring. A plating layer (not shown) of at least one of silver, gold and nickel can be formed on the surfaces of the substrate portions 12 and 14 which are parts of the metal sheet of the package aggregate, whereby light from the light emitting diode can be efficiently radiated to the outside. The metal-made substrate portions 12 and 14 are also good heat conductors and therefore, can act efficiently in dissipating heat generated involved in the supply of electrical power to the light emitting diode. In this way, the substrate portions 12 and 14 can fulfill three roles at the same time, that is, electrical conductors that allow flow of a current, reflection of light from the vertical geometry light emitting diode (in the region inside the opening of the reflector), and dissipation of heat generated by the diode. The substrate portions 12 and 14 functioning as electrical conductors are particularly effective for the flow of a large-capacity current, because their entirety is used to conduct electricity.

The conductive connecting member 15 has, for example, two arms 151 on the side connected to the upper electrode 111 of the vertical geometry light emitting diode 11. The thickness of the arm 151 or the number of arms can be changed. Also, the shape of the arm 151 can be arbitrarily changed. In place of the conductive connecting member 15 having an arm 151, a ribbon-like metal member may be used. The ribbon-like metal member can be easily produced and connected to other members and is a preferred conductive connecting member in the present invention.

As the material of the conductive connecting member 15, gold, silver, copper or an alloy thereof, which is a good electrical conductor, is preferred. In the case of a material other than gold, silver or an alloy thereof, the surface of the conductive connecting member 15 is preferably plated with gold or silver, because adherence to solder used for joining can be enhanced thereby and a larger current can be passed. The connecting member 15 electrically connected to the upper electrode 111 of the light emitting diode 11 through the arm 151 not only allows flow of a large-capacity current as compared with gold wire or the like having a diameter of approximately from 25 to 30 μm used in the prior art, but also can enhance the strength and heat dissipation depending on the shape of the cross-section and surface thereof.

Figure 16A:
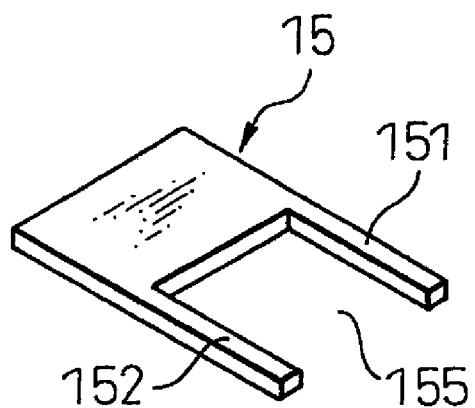
FIGS. 16A to 16C are schematic drawings illustrating variations of the conductive connecting member for use in the production method of a light emitting device of the present invention.

Variations of the conductive connecting member will be described below by referring to FIGS. 16A to 16C. The connecting member 15 shown in FIG. 16A is the same as the connecting member shown in FIGS. 2A to 2C and is used when housing the vertical geometry light emitting diode 11 in a housing recess 121 provided in the substrate portion 12. In the connecting member 15 of FIG. 16A, two arms 151 and 152 connected to the upper electrode 111 of the vertical geometry light emitting diode 11 and an opening 155 that is located between those arms and passes light irradiated from the sides of the vertical geometry light emitting diode are provided.

Figure 16B:
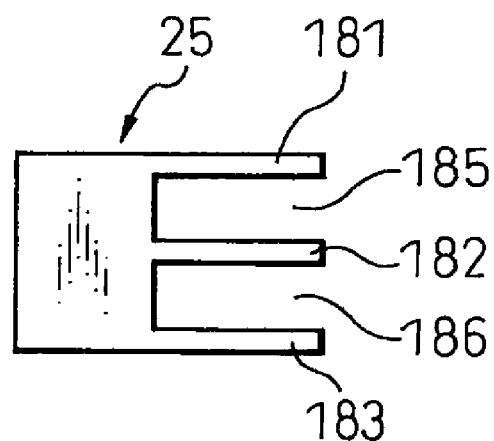

The connecting member 25 shown in FIG. 16B is also used for the examples shown in FIGS. 2A to 2C, where three arms 181, 182 and 183 connected to the upper electrode 111 of the vertical geometry light emitting diode 11 and openings 185 and 186 each of which is located between adjacent two arms and passes light irradiated from the sides of the vertical geometry light emitting diode are provided.

Figure 16C:
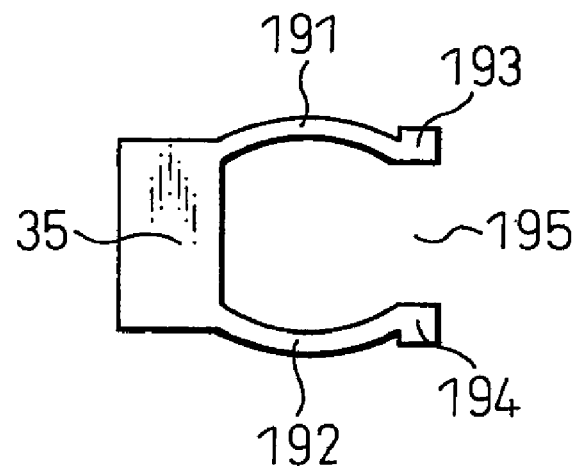

In the connecting member 35 illustrated in FIG. 16C, two arms 191 and 192 are bent outward, and the ends 193 and 194 of the arms 191 and 192 are made larger in the area than the arms 191 and 192. The bent arms 191 and 192 provide an opening 195 that passes a larger quantity of light irradiated from the sides of the vertical geometry light emitting diode.

The arms illustrated in FIGS. 16A to 16C may have an arbitrary shape and may be formed, for example, in a rod or flat shape.

Other variations of the conductive connecting member will be described below by referring to FIGS. 17A to 17D. The connecting member 45 shown in FIG. 17A has a bent part 201 in almost the center portion and is connected to the upper electrode of the vertical geometry light emitting diode 11 at the end 202. This connecting member 45 is used when a housing recess for housing the vertical geometry light emitting diode 11 is not provided in the substrate portion 12.

Figure 17A:
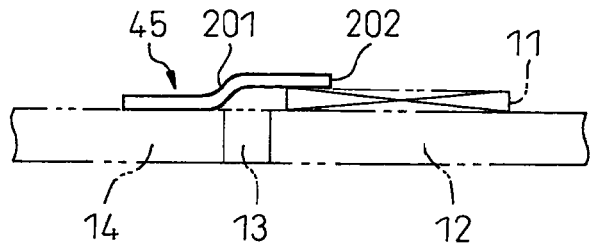
FIGS. 17A to 17D are schematic drawings illustrating other variations of the conductive connecting member.
Figure 17B:
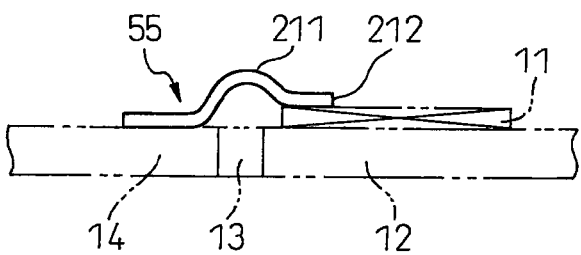

The connecting member 55 shown in FIG. 17B has a raised bent part 211 in almost the center portion and an end 212 connected to the upper electrode of the vertical geometry light emitting diode 11. The connecting member 65 shown in FIG. 17C has a bent part 221 almost in the center portion, the member being fabricated from a material having a nearly letter L shape like the connecting member shown in FIG. 3. The connecting member 55 shown in FIG. 17B and the connecting member 65 shown in FIG. 17C both are used when a housing recess for housing the vertical geometry light emitting diode 11 is not provided in the substrate portion 12.

Figure 17C:
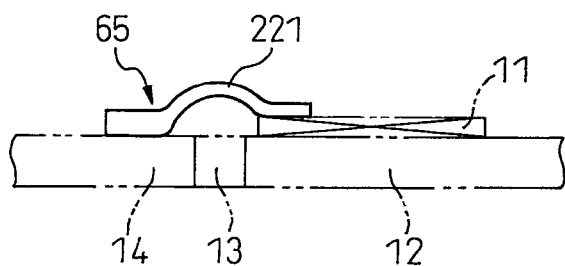
Figure 17D:
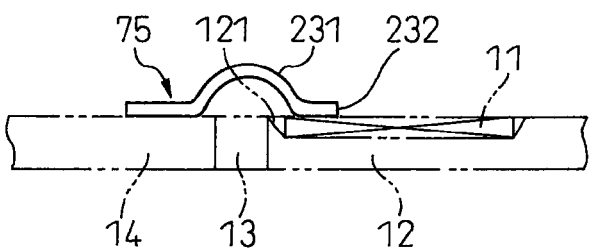

The connecting member 75 shown in FIG. 17D connects the upper electrode of the vertical geometry light emitting diode 11 housed in a housing recess 121 provided in the substrate portion 12 to the substrate portion 14 through a bent part 231.

The bent parts of the connecting members shown in FIGS. 17B to 17D make it easy to absorb the thermal stress generated due to flow of a large quantity of current. In FIGS. 17B to 17D, the bent parts are provided in a vertical direction, but as shown in FIG. 16C, it is also possible to provide the bent part in a horizontal direction. A structure where a bent part is provided in a horizontal direction enables irradiating a large quantity of light from the sides of the vertical geometry light emitting diode 11.

Figure 18:
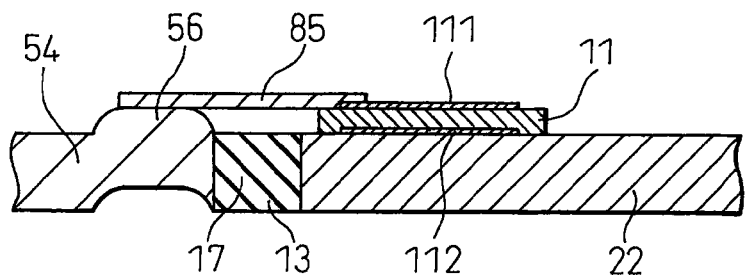
FIG. 18 is a drawing illustrating the connection of the upper electrode of the vertical geometry light emitting diode to the substrate portion by a conductive connecting member.

FIG. 18 is a cross-sectional view for illustrating another example of the connection between the upper electrode of the vertical geometry light emitting diode mounted on one substrate portion and the other substrate portion. In FIG. 18, a housing recess is not provided in the substrate portion 22 on which the vertical geometry light emitting diode 11 is mounted, and a projection 56 for fixing a connecting member 85 thereon is provided in the other substrate portion 54. The lower electrode 112 of the vertical geometry light emitting diode 11 is connected to the substrate portion 22. The connecting member 85 is plate-shaped and one end thereof is joined to the upper electrode 111 of the vertical geometry light emitting diode 11, while the other end is joined to the top of the projection 56 provided in the substrate portion 54. In this example, a projection 56 is provided by designing the shape of the substrate portion 54, and the top of the projection 56 is located at the same height as the top of the upper electrode 111 of the vertical geometry light emitting diode 11, whereby not only a housing recess need not be provided in the other substrate portion 22 but also the shape of the connecting member 55 can be simplified.

In each of the connection members 15, 25, 35, 45, 55, 65, 75 and 85 described by referring to FIGS. 16A to 16C, 17A to 17D, and 18, the side (substrate portion-joining part) connected to the substrate portion 14 or 54 has a large area to be contacted with the substrate portion 14. Such a conductive connecting member can be easily produced from a metal material. Therefore, the light emitting device of the present invention using a conductive connecting member not only allows flowing a large-capacity current (for example, 350 mA or more) as compared with a light emitting device using one or two gold wires or the like for connection, but also can dissipate heat from the conductive connecting member itself as well, which is composed of a metal material.

Figure 19A:
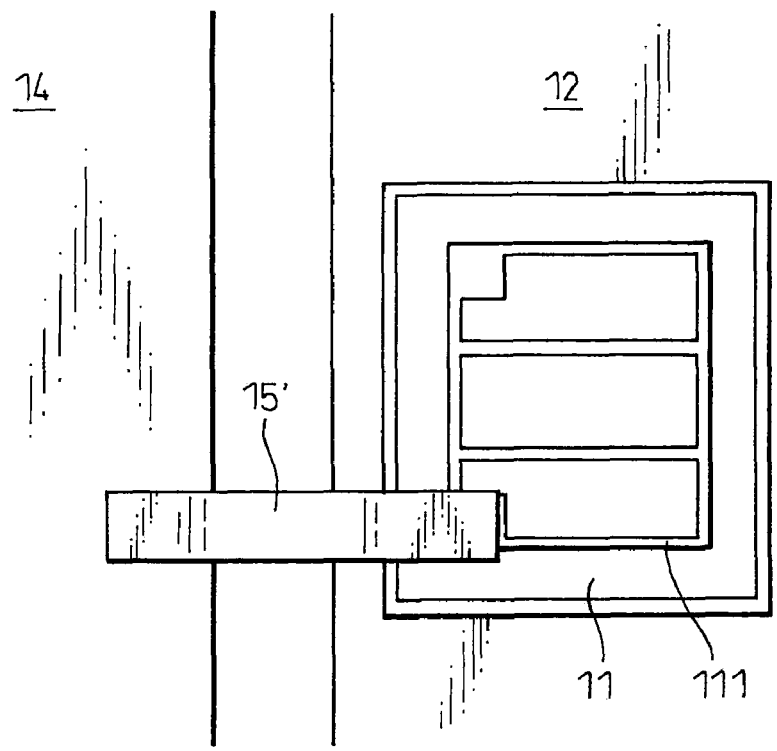
FIGS. 19A and 19B are schematic drawings illustrating an example where a gold-made ribbon is used as the conductive connecting member.

As the conductive connecting member, a ribbon-like metal member may also be used. In this case, as is schematically shown in FIGS. 19A (top view) and 19B (side view), the upper electrode 111 of the vertical geometry light emitting diode 11 mounted on one substrate portion 12 and the other substrate portion 14 may be simply connected by a ribbon-like connecting member 15'. Joining of the ribbon-shaped metal member 15' to the upper electrode 11 and to the substrate portion 14 can be easily performed using a solder material. A preferred ribbon-like metal member is made of gold. Also, a conductive connecting member, both ends of which are flattened by, for example, pressing a gold wire having a diameter of 60 to 100 μm, may be used.

Figure 19B:
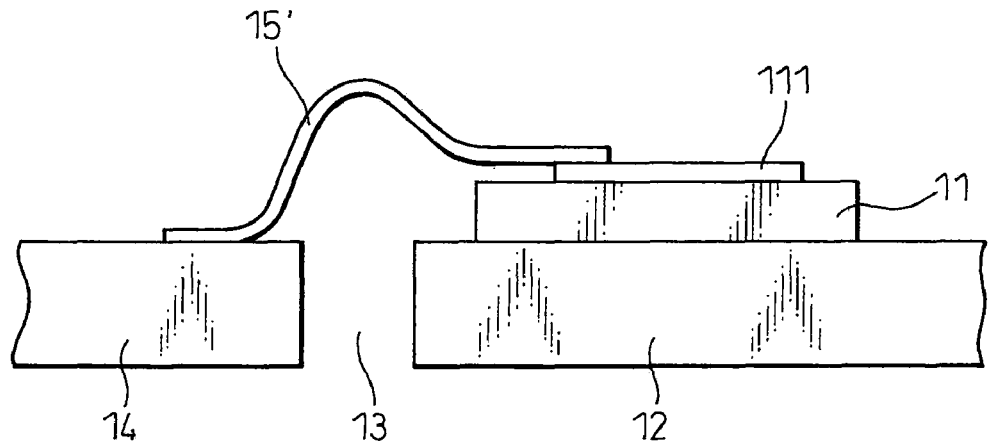

The cross-sectional area of the conductive connecting member, through which a current flows, is preferably at least from 1,500 to 10,000 $\mu m^2$. More preferably, the cross-sectional area of the conductive connecting member, through which a current flows, is at least from 2,000 to 6,000 $\mu m^2$. This cross-sectional area is the area of the cross-section perpendicular to the lengthwise direction thereof in the case of a ribbon-like metal member as shown in FIGS. 19A and 19B, while in the case of a member having two or more arms as shown in FIGS. 16A and 16B, is the total of areas of the cross-sections perpendicular to the direction of length of respective arms. For example, in the case of a gold ribbon-like conductive connecting member, the width of the ribbon may be from 150 to 200 µm, and the thickness may be approximately from 20 to 25 µm.

Figure 20:
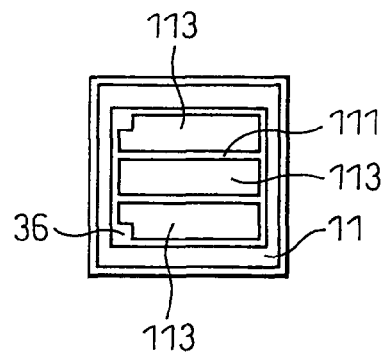
FIG. 20 is a drawing illustrating the upper electrode of the vertical geometry light emitting diode.

FIG. 20 is a plan view of an upper electrode of a vertical geometry light emitting diode, to which a conductive connecting member 15 or 15' is connected. The upper electrode 111 of the vertical geometry light emitting diode 11 shown in this drawing has three parallel rectangular openings 113. On the left side of the upper electrode 111 (the side to which a connecting member is connected), connection ends 36 having a large area are formed. The connection end 36 may be made to have almost the same area as the area of each of the ends 193 and 194 of the connecting member 35 shown in FIG. 16C, whereby each other's electrical connection can be enhanced.

In FIG. 20, the upper electrode 111 of the vertical geometry light emitting diode 11 is produced in the form of a partial electrode having three parallel rectangular openings 113, and the diode 11 efficiently radiates light from the portions other than the partial electrode to the outside. In some cases, the upper electrode 111 may be formed in a U or C shape.

Joining between one substrate portion and the lower electrode of the vertical geometry light emitting diode, joining between the conductive connecting member and the upper electrode of the vertical geometry light emitting diode, and joining between the conductive connecting member and the substrate portion different from the substrate portion having mounted thereon the vertical geometry light emitting diode are performed using a solder material. A preferred solder material is an eutectic solder. As the eutectic solder, a gold-tin-based, tin-silver-copper-based, tin-silver-based or indium-based eutectic solder, or a known solder material, such as gold-tin-based solder paste, can be used. In some cases, a solder material other than those referred to here may also be used. In the joining by a solder material, the joining strength can be increased by applying gold plating to the members that are joined together.

In the production method of a light emitting device of the present invention, the package aggregate used is not limited only to the vertical geometry light emitting diode package aggregate described by referring to FIGS. 4A and 4B and FIG. 6, but a package aggregate having a peripheral slit divided into a plurality of portions and/or at least one peripheral weakened part, surrounding the periphery of each package unit (FIG. 8, 9 or 10), or a package aggregate having a plurality of leads holding the package unit and a peripheral opening divided into a plurality of portions by the leads, in the periphery of each package unit (FIG. 12, 13, 14 or 15), may also be used.

Figure 21:
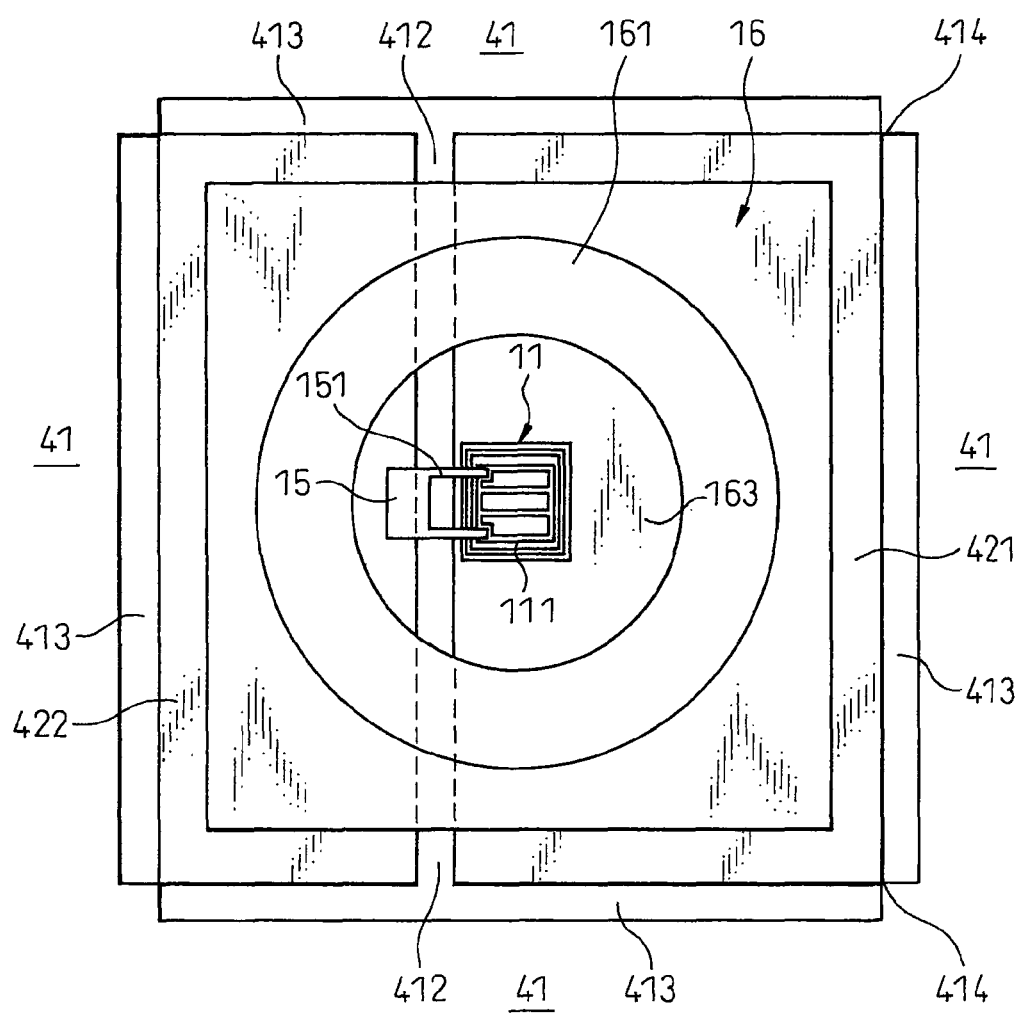
FIG. 21 is a drawing illustrating a light emitting device produced using a vertical geometry light emitting diode package aggregate where peripheral slits are provided.

FIG. 21 illustrates an example of the light emitting device produced using a vertical geometry light emitting diode package aggregate where peripheral slits are provided. The light emitting device of this drawing is produced using the vertical geometry light emitting diode package aggregate provided with peripheral slits shown in FIG. 8, and has a pair of substrate portions 421 and 422 separated by an internal slit 412, in the region surrounded by four peripheral slits 413 (these are interrupted by minute links 414 present at ends thereof) formed in the metal sheet 41. A hollow reflector 16 having a penetrating opening provided with an inclined reflecting surface 161 formed to spread upward is bonded to substrate portions 421 and 422 to expose both ends of the internal slit 412 and cover parts of the internal slit 412. The vertical geometry light emitting diode 11 is disposed on one substrate portion 421, and the upper electrode 111 of the diode is connected to the other substrate portion 422 by a conductive connecting member 15 having arms 151.

In the light emitting device produced by the present invention, the vertical geometry light emitting diode can be sealed, if desired, by filling a transparent sealing material in the opening of the reflector. As the sealing material, an elastomer-type thermosetting silicone can be used. In order to reduce the stress imposed on the joints by absorbing the thermal stress generated when flowing a large current (for example, 350 mA or more) to the vertical geometry light emitting diode, the silicone sealing material preferably has a hardness of 15 to 85 in terms of Shore A (hardness of rubber). The Shore A hardness of the silicone sealing material is more preferably from 20 to 80.

The rated current flowed to the vertical geometry light emitting diode of the light emitting device produced by the present invention can be 350 mA or more. In the case of filling a transparent sealing material in the opening of the reflector, when the rated current of the light emitting diode is less than 350 mA, heat is not readily generated and the hardness of the sealing resin does not need to be taken into consideration.

A fluorescent material-containing film in a desired color can be provided on the top of the opening of the reflector (on the surface of the sealing material when the light emitting diode is sealed). The fluorescent material-containing film can convert the color of light irradiated from the vertical geometry light emitting diode into a desired color.

A fluorescent material may be previously incorporated into the sealing material. The sealing material containing a fluorescent material can convert light radiated from the front and sides of the vertical geometry light emitting diode into a desired color without a fluorescent material-containing film provided on its surface.

Individual light emitting devices or a group consisting of a predetermined number (two or more) of light emitting devices can be separated from the light emitting device aggregate produced using the package aggregate. The light emitting device produced by the present invention can be utilized also for a large-size system, because an electric power with rating of 350 mA or more can be supplied to a single vertical geometry light emitting diode. For example, a light guide plate or a liquid crystal display device applicable to an advertising display device or the like, having a size approximately of 3 mm wide and 20 mm long, can be obtained.

Figure 22A:
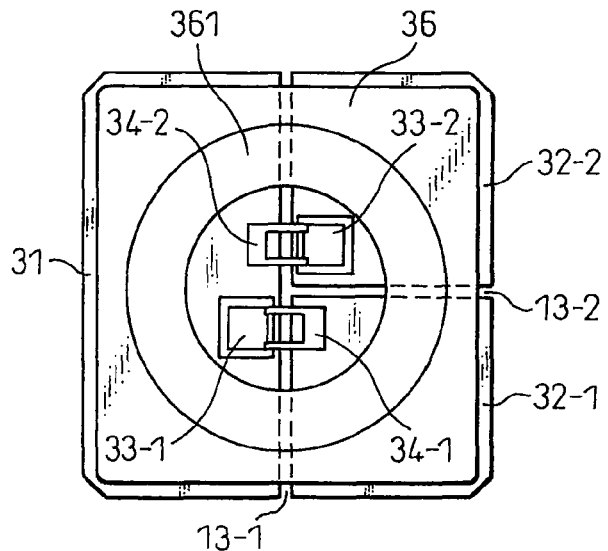
FIGS. 22A to 22D are drawings illustrating a light emitting device produced by the method of the present invention.
Figure 22B:
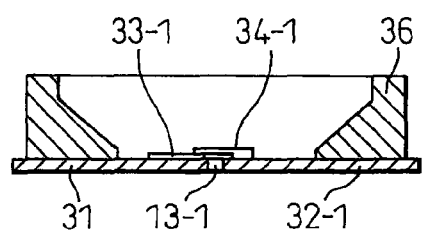
Figure 22C:
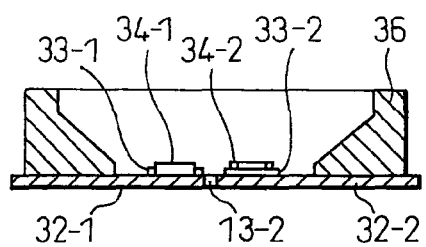
Figure 22D:
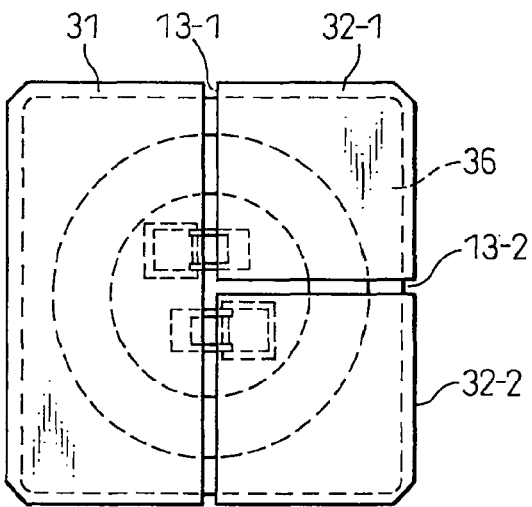

FIGS. 22A to 22D illustrate an example of the light emitting device produced using the vertical geometry light emitting diode package aggregate shown in FIG. 12 where the package unit has a peripheral opening divided by leads connected to its substrate portions. FIG. 22A is a plan view of the light emitting device, FIGS. 22B and 22C are cross-sectional views, and FIG. 22D is a bottom view. The package unit used in the light emitting device of this example is composed of a nearly rectangular substrate portion 31 and two nearly square substrate portions 32-1 and 32-2, where adjacent substrate portions are insulated from each other by slits 13-1 and 13-2 provided therebetween.

The lower electrode (not shown) of one vertical geometry light emitting diode 33-1 is joined to the substrate portion 31 by solder, and the upper electrode of the vertical geometry light emitting diode 33-1 is joined to the substrate portion 32-1 through a conductive connecting member 34-1. Also, the lower electrode of the other vertical geometry light emitting diode 33-2 is joined to the substrate portion 32-2, and the upper electrode of the vertical geometry light emitting diode 33-2 is joined to the substrate portion 31 through a conductive connecting member 34-2. In this way, the vertical geometry light emitting diodes 33-1 and 33-2 can be connected in series or in parallel.

In the light emitting device shown in FIGS. 22A to 22D produced in a single package unit, two vertical geometry light emitting diodes 33-1 and 33-2 are arranged such that the centers thereof are on either diagonal line of a quadrangle composed by the three substrate portions 31, 32-1 and 32-2. By virtue of this configuration, light from two vertical geometry light emitting diodes 33-1 and 33-2 of this light emitting device is efficiently radiated forward by a reflecting surface 361 of a reflector 36 and by the surfaces of the substrate potions 31, 32-1 and 32-2.

Figure 23A:
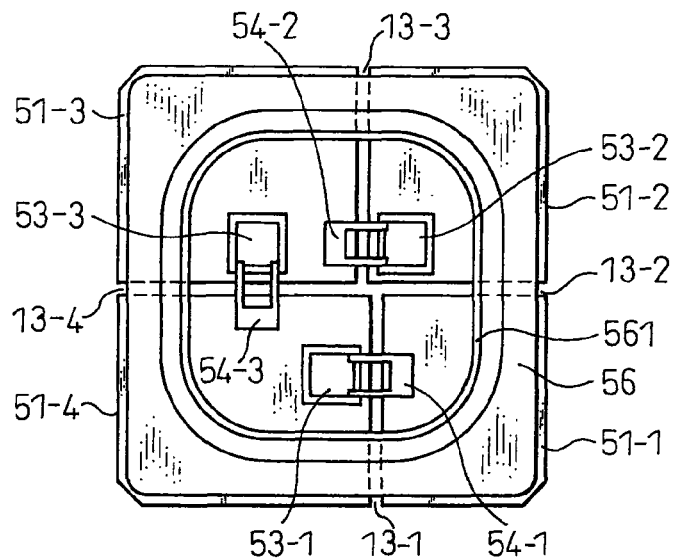
FIGS. 23A to 23D are drawings illustrating another example of the light emitting device produced by the method of the present invention.
Figure 23B:
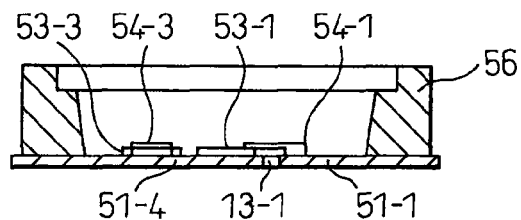
Figure 23C:
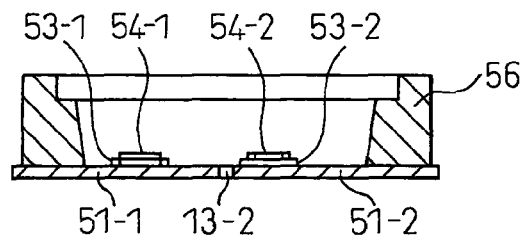
Figure 23D:
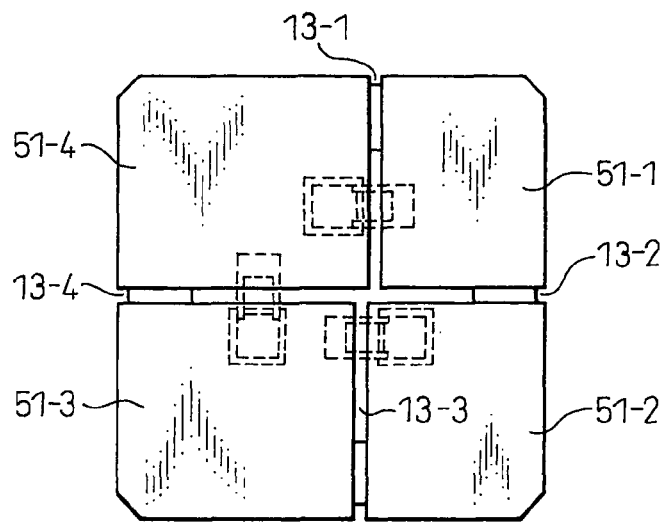

FIGS. 23A to 23D illustrate an example of the light emitting device produced using the vertical geometry light emitting diode package aggregate shown in FIG. 13 where the package unit has a peripheral opening divided by leads connected to the substrate portions. FIG. 23A is a plan view of the light emitting device, FIGS. 23B and 23C are cross-sectional views, and FIG. 23D is a bottom view. The package unit in this example is composed of four quadrangular substrate portions 51-1, 51-2, 51-3 and 51-4 differing in size, where adjacent substrate portions are insulated from each other by slits 13-1, 13-2, 13-3 and 13-4 provided therebetween.

The lower electrode (not shown) of one vertical geometry light emitting diode 53-1 is joined to the substrate portion 51-4, and the upper electrode of the vertical geometry light emitting diode 53-1 is joined to the substrate portion 51-1 through a conductive connecting member 54-1. Similarly, the lower electrode of another vertical geometry light emitting diode 53-2 is joined to the substrate potion 51-2, and the upper electrode of the vertical geometry light emitting diode 53-2 is joined to the substrate portion 51-3 through a conductive connecting member 54-2. Furthermore, the lower electrode of still another vertical geometry light emitting diode 53-3 is joined to the substrate portion 51-3, and the upper electrode of the vertical geometry light emitting diode 53-3 is joined to the substrate potion 51-4 through a conductive connecting member 54-3. In this way, the vertical geometry light emitting diodes 53-2, 53-3 and 53-1 are connected in series.

In the light emitting device shown in FIGS. 23A to 23D produced in a single package unit, three vertical geometry light emitting diodes 53-1, 53-2 and 53-3 are arranged such that the centers thereof are on a circle having for a center thereof the center of a quadrangle composed by the four substrate portions, and are positioned at equal intervals. By virtue of this configuration, light from the three vertical geometry light emitting diodes 53-1, 53-2 and 53-3 of this light emitting device is efficiently radiated forward by a reflecting surface 561 of a reflector 56 and by the surfaces of the substrate potions 51-1, 51-2, 51-3 and 51-4. In the light emitting device of this example, three vertical geometry light emitting diodes are used, but two diodes, which are connected in parallel, may be used.

Figure 24A:
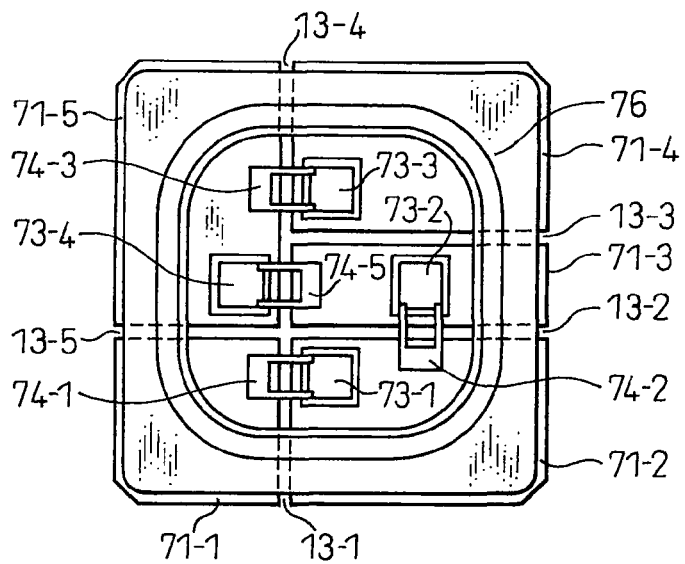
FIGS. 24A to 24D are drawings illustrating another example of the light emitting device produced by the method of the present invention.
Figure 24B:
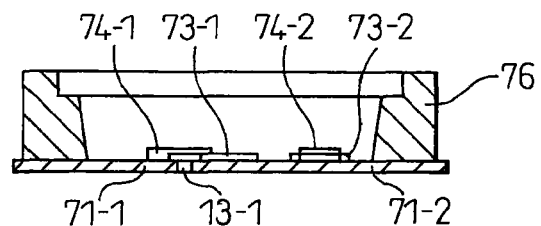
Figure 24C:
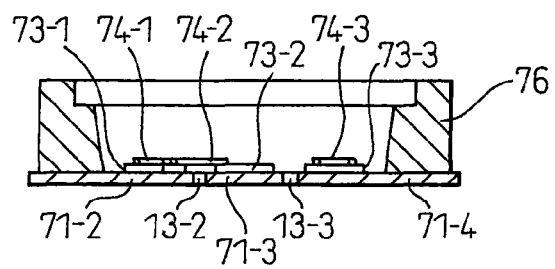
Figure 24D:
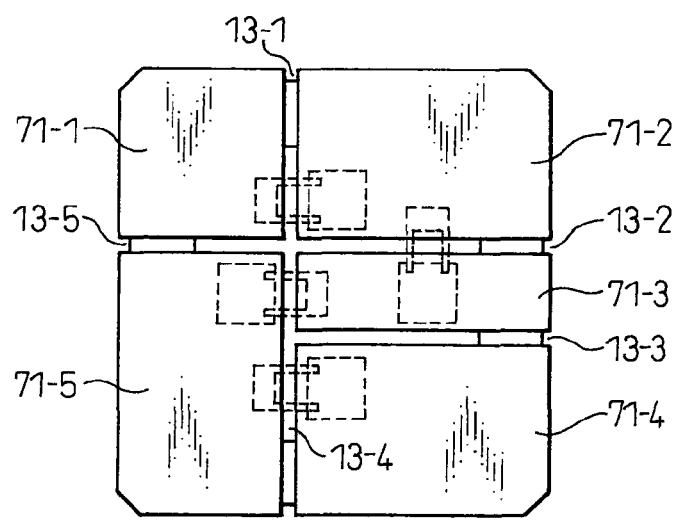
Figure 25A:
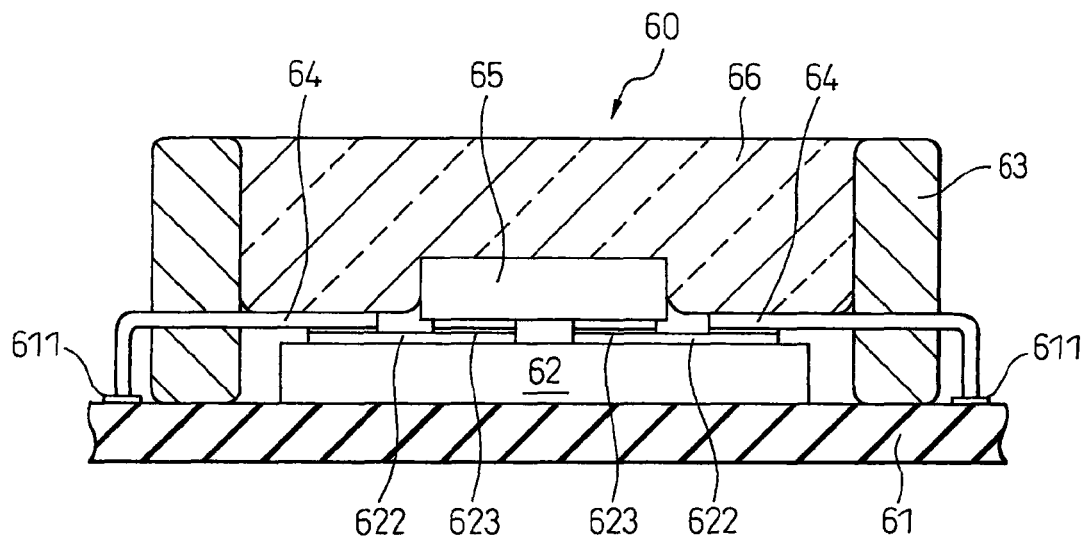
FIGS. 25A and 25B are drawings schematically illustrating a light emitting diode assembly of the prior art.
Figure 25B:
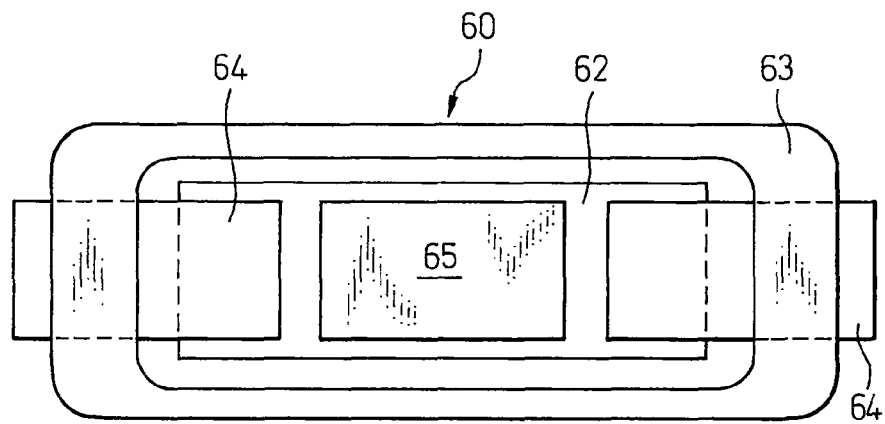

FIGS. 24A to 24D illustrate an example of the light emitting device produced using the vertical geometry light emitting diode package aggregate shown in FIG. 14 where the package unit has a peripheral opening divided by leads connected to the substrate portions. FIG. 24A is a plan view of the light emitting device, FIGS. 24B and 24C are cross-sectional views, and FIG. 24D is a bottom view. The package unit in this example is composed of five quadrangular substrate portions 71-1, 71-2, 71-3, 71-4 and 71-5 differing in size, where adjacent substrate portions are insulated from each other by slits 13-1, 13-2, 13-3, 13-4 and 13-5 provided therebetween.

The lower electrode (not shown) of one vertical geometry light emitting diode 73-3 is joined to the substrate portion 71-4, and the upper electrode of the vertical geometry light emitting diode 73-3 is joined to the substrate portion 71-5 through a conductive connecting member 74-3. Similarly, the lower electrode of another vertical geometry light emitting diode 73-4 is joined to the substrate potion 71-5, and the upper electrode of the vertical geometry light emitting diode 73-4 is joined to the substrate portion 71-3 through a conductive connecting member 74-5. Furthermore, the lower electrode of still another vertical geometry light emitting diode 73-2 is joined to the substrate portion 71-3, and the upper electrode of the vertical geometry light emitting diode 73-2 is joined to the substrate potion 71-2 through a conductive connecting member 74-2. In addition, the lower electrode of still another vertical geometry light emitting diode 73-1 is joined to the substrate portion 71-2, and the upper electrode of the vertical geometry light emitting diode 73-1 is joined to the substrate potion 71-1 through a conductive connecting member 74-1. In this way, the vertical geometry light emitting diodes 73-3, 73-4, 73-2 and 73-1 are connected in series. The number and fashion of connection of vertical geometry light emitting diodes in this example can be arbitrarily changed.

In the light emitting device shown in FIGS. 24A to 24D produced in a single package unit, four vertical geometry light emitting diodes 73-3, 73-4, 73-2 and 73-1 are arranged such that the centers thereof are on a circle having for a center thereof the center of a quadrangle composed by the five substrate portions, and are positioned at equal intervals. By virtue of this configuration, light from four vertical geometry light emitting diodes 73-3, 73-4, 73-2 and 73-1 of this light emitting device is efficiently radiated forward by a reflecting surface of a reflector 76 and by the surfaces of the substrate potions 71-1, 71-2, 71-3, 71-4 and 71-5.

The size of the vertical geometry light emitting diode used in the production of a light emitting device by the present invention is about 1.0 mm×1.0 mm, and the thickness is approximately 0.1 mm. The vertical geometry light emitting diode may be, for example, a gallium nitride-based vertical geometry light emitting diode. The gallium nitride-based vertical geometry light emitting diode is composed of a lower electrode, a substrate positioned above the lower electrode, a p-type gallium nitride-based layer on the substrate, a quantum well structured active layer formed on the p-type gallium nitride-based layer, an n-type gallium nitride-based layer formed on the quantum well structured active layer, and an upper partial electrode formed on the n-type gallium nitride-based layer.

A light emitting device according to the present invention produced by connecting a conductive connecting member (gold ribbon having a width of 200 μm and a thickness of 25 μm) to an LED (produced by SemiLEDs, a gallium nitride-based vertical geometry light emitting diode that emits blue light at a wavelength of 450 μm) with solder was compared with a light emitting device produced by connecting gold wires to the same LED by ultrasonic wire bonding according to the conventional technique.

In the case of the present invention, the LED was disposed on one substrate portion through a gold-tin (22%) solder paste in the center of each package of the package aggregate of the present invention. Subsequently, the above solder paste was applied to the upper electrode of the LED as well as a connection place of the other substrate portion, and a gold ribbon was disposed thereon. The package aggregate was placed in a heating device at about 300° C., and the solder was melted followed by cooling, thereby joining the members. Individual packages were separated from the package aggregate to produce blue light-emitting packages. White light-emitting packages can also be produced by fixing fluorescent material-containing films on the tops of the reflector openings of the respective packages produced. Various colors of emitted light can also be obtained by combining various kinds of fluorescent materials. Occurrence of defective pieces was not observed in both the connection step of the production process and the test of passing a current of 350 to 500 mA to the completed light emitting devices.

In the case of the conventional technique, two gold wires having a diameter of 30 μm were connected to the upper electrode of the LED by ultrasonic wire bonding. In this case, defective pieces with light emission failure were formed at a rate of about 10% due to ultrasonic oscillation of the wire bonding. Also, when a current of 350 mA was passed to the light emitting devices produced, burning due to abnormal conducting occurred at a rate of about 4%.

Furthermore, in long-term on-off conducting tests (consisting of switching on and off in 30 second cycle for 1,000 hours), defective pieces attributable to the growth of microcracks were observed at a rate of 10 to 15% in the case of the light emitting devices according to the conventional technique, but no defective piece was observed in the case of the light emitting devices according to the present invention.

The tensile strengths are compared between the gold wire (the conventional technique) and gold ribbon (the present invention) used. The gold wire or gold ribbon joining the upper electrode of the vertical geometry light emitting diode to the substrate portion was pulled in the center by a gradually increased force. In the tensile test on a single gold wire having a diameter of 30 μm, the gold wire was broken in the vicinity of the joint at a force of 11 g. In this case, it was found that a weak point was present in the vicinity of the joint. When the diameter of the gold wire was decreased to 25 μm, the gold wire was broken in the vicinity of the joining part again at a force of 7 g in the tensile test. In the case of the gold ribbon (width: 200 μm, thickness: 25 μm), the gold ribbon was broken at the pulled portion at a force of from 100 to 150 g.

As apparent from these, the light emitting device produced by the present invention can have the following characteristics:

(1) A conductive member to be connected to a light emitting diode can be joined to the diode by a solder material instead of wire bonding, and therefore a conductive member having a large cross-sectional area can be used.

(2) By use of soldering for connection of conductive members, variation in the bonding strength is small (for example, in the case of using a gold ribbon as a connecting member, it is not broken in the vicinity of a joint in a tensile test but the gold ribbon itself is broken).

(3) A conductive member having a large cross-sectional area is used, and therefore the light emitting device can be strong to vibration and reinforcement with a sealing material can be omitted.

(4) Unlike the connection by ultrasonic wire bonding, ultrasonic oscillation and pressure are not applied during connection of the conductive member, and fine control of the apparatus used is not necessary.

Although various examples of the present invention are described in detail above, the present invention is not limited thereto, and various changes and modifications may be made therein without departing from those matters described in the claims. For example, materials used for the reflector and reflecting film provided thereon in the present invention may be known materials. An adhesive used for fixing the reflector to the metal sheet may also be a known adhesive.

The invention claimed is:

1. A production method of a light emitting device having a vertical geometry light emitting diode as a light source, comprising the steps of:

preparing a vertical geometry light emitting diode package aggregate comprising a metal sheet having formed thereon a number of vertical geometry light emitting diode package units, each package unit comprising two or more substrate portions as parts of the metal sheet, which are separated by a slit, and a reflector having a penetrating opening and being adhered to said two or more substrate portions to cover parts of said slit such that the vertical geometry light emitting diode-mounting position is exposed in the inner side of the opening, and the end parts of said slit are exposed in the outer side of said reflector, and mounting a vertical geometry light emitting diode on one of said substrate portions of each package unit through a lower electrode thereof, and connecting an upper electrode of said vertical geometry light emitting diode to the substrate potion different from the substrate portion on which said vertical geometry light emitting diode is mounted, through a conductive connecting member, wherein the mounting and the connection are carried out by use of solder.

2. The production method of a light emitting device as claimed in claim 1, wherein melting and subsequent solidification by cooling of solder disposed between one of said substrate portions and the lower electrode of said vertical geometry light emitting diode for mounting said vertical geometry light emitting diode on the one of said substrate portions are performed simultaneously with melting and subsequent solidification by cooling of solder disposed between said upper electrode and said conductive connecting member and between said other substrate portion and said conductive connecting member for connecting the upper electrode of said vertical geometry light emitting diode to said other substrate portion through the conductive connecting member.

3. The production method of a light emitting device as claimed in claim 1, wherein said vertical geometry light emitting diode is mounted on one of said substrate portions through melting and subsequent solidification by cooling of solder disposed between the one of said substrate portions and the lower electrode of said vertical geometry light emitting diode and thereafter, the upper electrode of said vertical geometry light emitting diode is connected to said other substrate portion through the conductive connecting member through melting and subsequent solidification by cooling of solder disposed between said upper electrode and said conductive connecting member and between said other substrate portion and said conductive connecting member.

4. The production method of a light emitting device as claimed in claim 1, wherein a package aggregate having a peripheral slit divided into a plurality of portions and/or at least one peripheral weakened part, surrounding the periphery of each package unit, is used as said vertical geometry light emitting diode package aggregate.

5. The production method of a light emitting device as claimed in claim 1, wherein a package aggregate having, in the periphery of each package unit, a peripheral opening divided into a plurality of portions by a plurality of leads with one end being connected to the package unit is used as said vertical geometry light emitting diode package aggregate.

6. The production method of a light emitting device as claimed in claim 1, wherein said conductive connecting member is made of a metal and composed of at least one arm connected to the upper electrode of said vertical geometry light emitting diode and a substrate portion-joining part communicated with the arm and joined to said other substrate portion.

7. The production method of a light emitting device as claimed in claim 6, wherein the surface of said conductive connecting member is plated with gold and/or silver.

8. The production method of a light emitting device as claimed in claim 1, wherein a ribbon-like metal member is used as said conductive connecting member.

9. The production method of a light emitting device as claimed in claim 1, which further comprises the step of filling a transparent sealing material in the penetrating opening of said reflector to seal said vertical geometry light emitting diode, after the step of mounting said vertical geometry light emitting diode on one of said substrate portions and connecting the upper electrode of said vertical geometry light emitting diode to said other substrate portion.

10. The production method of a light emitting device as claimed in claim 9, wherein an elastomer-type thermosetting silicone is used as said sealing material.

11. The production method of a light emitting device as claimed in claim 10, wherein the hardness of said silicone as the sealing material is from 15 to 85 in terms of Shore A (hardness of rubber).

* * * * *